US008713344B2

(12) United States Patent
Oh

(10) Patent No.: US 8,713,344 B2
(45) Date of Patent: *Apr. 29, 2014

(54) METHODS AND APPARATUS FOR CLOCK SIGNAL SYNCHRONIZATION IN A CONFIGURATION OF SERIES CONNECTED SEMICONDUCTOR DEVICES

(75) Inventor: HakJune Oh, Kanata (CA)

(73) Assignee: Mosaid Technologies Incorporated, Ottawa, Onatrio (CA)

(*) Notice: Subject to any disclaimer, the term of this patent is extended or adjusted under 35 U.S.C. 154(b) by 421 days.

This patent is subject to a terminal disclaimer.

(21) Appl. No.: 12/948,186

(22) Filed: Nov. 17, 2010

(65) Prior Publication Data
US 2011/0060934 A1 Mar. 10, 2011

Related U.S. Application Data

(63) Continuation of application No. 11/959,996, filed on Dec. 19, 2007, now Pat. No. 7,865,756.

(60) Provisional application No. 60/894,246, filed on Mar. 12, 2007.

(51) Int. Cl.
G06F 1/12 (2006.01)
(52) U.S. Cl.
USPC .......................................... 713/400
(58) Field of Classification Search
USPC ................................. 713/400, 500
See application file for complete search history.

(56) References Cited

U.S. PATENT DOCUMENTS 5,087,829 A * 2/1992 Ishibashi et al. .............. 327/152
5,404,460 A 4/1995 Thomsen et al.
(Continued)

FOREIGN PATENT DOCUMENTS

JP 02107036 4/1990
JP 07058611 3/1995
(Continued)

OTHER PUBLICATIONS

Stephen L. Diamond, "SyncLink: High-speed DRAM for the future", Micro Standards, IEEE Micro, Dec. 1996, pp. 74-75.

(Continued)

Primary Examiner — Kim Huynh
Assistant Examiner — Zahid Choudhury

(57) ABSTRACT

A system includes a system controller and a configuration of series-connected semiconductor devices. Such a device includes an input for receiving a clock signal originating from a previous device, and an output for providing a synchronized clock signal destined for a succeeding device. The device further includes a clock synchronizer for producing the synchronized clock signal by processing the received clock signal and an earlier version of the synchronized clock signal. The device further includes a device controller for adjusting a parameter used by the clock synchronizer in processing the earlier version of the synchronized clock signal. The system controller has an output for providing a first clock signal to a first device, and an input for receiving a second clock signal from a second device. The second clock signal corresponds to a version of the first clock signal that has undergone processing by a clock synchronizer in at least one of the devices. The system controller further includes a detector for processing the first and second clock signals to detect a phase difference therebetween; and a synchronization controller for commanding an adjustment to the clock synchronizer in at least one of the devices based on the phase difference detected by the detector.

5 Claims, 17 Drawing Sheets

(56) References Cited

U.S. PATENT DOCUMENTS

| | | | |
|---|---|---|---|
| 5,430,859 | A | 7/1995 | Norman et al. |
| 5,475,854 | A | 12/1995 | Thomsen et al. |
| 5,729,683 | A | 3/1998 | Le et al. |
| 5,768,173 | A | 6/1998 | Seo et al. |
| 5,806,070 | A | 9/1998 | Norman et al. |
| 6,052,331 | A | 4/2000 | Araki et al. |
| 6,065,126 | A * | 5/2000 | Tran et al. ............... 713/401 |
| 6,144,576 | A | 11/2000 | Leddige et al. |
| 6,148,363 | A | 11/2000 | Lofgren et al. |
| 6,304,921 | B1 | 10/2001 | Rooke |
| 6,317,812 | B1 | 11/2001 | Lofgren et al. |
| 6,715,044 | B2 | 3/2004 | Lofgren et al. |
| 6,839,301 | B2 * | 1/2005 | Lin et al. ............... 365/233.12 |
| 6,928,501 | B2 | 8/2005 | Andreas et al. |
| 6,944,697 | B2 | 9/2005 | Andreas |
| 6,950,325 | B1 | 9/2005 | Chen |
| 7,031,221 | B2 | 4/2006 | Mooney et al. |
| 7,032,039 | B2 | 4/2006 | DeCaro |
| 7,168,027 | B2 | 1/2007 | Lee et al. |
| 7,414,444 | B2 * | 8/2008 | Drexler et al. ............... 327/158 |
| 7,752,364 | B2 | 7/2010 | Oh et al. |
| 2001/0009530 | A1 | 7/2001 | Maeda |
| 2001/0050856 | A1 | 12/2001 | Matsuzaki |
| 2004/0148482 | A1 | 7/2004 | Grundy et al. |
| 2005/0005181 | A1 | 1/2005 | Lee et al. |
| 2005/0062510 | A1 | 3/2005 | Zarate et al. |
| 2007/0046346 | A1 | 3/2007 | Minzoni |
| 2007/0076479 | A1 | 4/2007 | Kim et al. |
| 2007/0076502 | A1 | 4/2007 | Pyeon et al. |
| 2007/0086268 | A1 | 4/2007 | Shaetfer et al. |
| 2007/0096774 | A1 | 5/2007 | Yang et al. |
| 2007/0186034 | A1 | 8/2007 | Mes |
| 2007/0233903 | A1 | 10/2007 | Pyeon |
| 2007/0234071 | A1 | 10/2007 | Pyeon |
| 2008/0140899 | A1 | 6/2008 | Oh et al. |
| 2008/0140916 | A1 | 6/2008 | Oh et al. |
| 2008/0226004 | A1 | 9/2008 | Oh |
| 2009/0129184 | A1 | 5/2009 | Schuetz |

FOREIGN PATENT DOCUMENTS

| | | | |
|---|---|---|---|
| JP | 2007500994 | | 1/2007 |
| WO | 2005031548 | | 4/2005 |
| WO | 2005/106888 | A1 | 11/2005 |
| WO | 2007/013444 | A1 | 2/2007 |
| WO | 2007/036048 | A1 | 4/2007 |
| WO | 2007/109886 | A1 | 10/2007 |
| WO | 2008/022454 | A1 | 2/2008 |
| WO | 2008/067652 | A1 | 6/2008 |
| WO | 2008/074126 | A1 | 6/2008 |

OTHER PUBLICATIONS

Stein Gjessing et al., "A RAM link for high speed", IEEE Spectrum, Oct. 1992, pp. 52-53.
Stein Gjessing et al., "RamLink: A High-Bandwidth Point-to-Point Memory Architecture", Copyright 1992 IEEE, pp. 328-331.
Stein Gjessing et al., "Performance of the RamLink Memory Architcture", Copyright 1994 IEEE, pp. 154-162.
John G. Maneatis, "Low-Jitter Process-Independent DLL and PLL Based on Self-Biased Techniques", IEEE Journal of Solid-State Circuits, vol. 31, No. 11, Nov. 1996, pp. 1723-1732.
Yoichi Oshima et al., "High-Speed Memory Architectures for Multimedia Applications", IEEE, Circuits & Devices, Jan. 1997, pp. 8-13.
Joseph Kennedy et al., "A 2Gb/s Point-to-Point Heterogeneous Voltage Capable DRAM Interface for Capacity-Scalable Memory Subsystems", IEEE ISSCC 2004/Session 11/DRAM/11.8, 10 pages.
Jae-Kwan Kim et al., "A 3.6Gb/s/pin Simultaneous Bidirectional (SBD) I/O Interface for High-Speed DRAM", IEEE ISSCC 2004 / Session 22 / DSL and Multi-Gb/s I/O / 22.7, 8 pages.
Craig L. King et al., "Communicating with Daisy Chained MCP42XXX Digital Potentiometers", Microchip AN747, 2001 Microchip Technology Inc., 8 pages.
"1024K I2CTM CMOS Serial EEPROM", Microchip 24AA1025/ 24LC1025/ 24FC1025, 2006 Microchip Technology Inc., 22 pages.
"How to Use OTP Registers for Security Applications", Application Note 717, Oct. 1999, Intel Corporation, 10 pages.
Intel, "Clocking—Lecture 2 and 3, Purpose—Clocking Design Topics", http://download.intel.com/education/highered/signal/ELCT865/Class2_3_4_Clocking.ppt, Dec. 4, 2002, 42 pages.
Atmel—"8-megabit 2.5-volt Only or 2.7-volt Only DataFlash"—AT5DB081B, Rev. 2225H-DFLSH-10/04, Atmel Corporation 2004, 33 pages.
ST—M25P20—"2Mbit, Low Voltage, Serial Flash Memory With 40MHz SPI Bus Interface", Aug. 2005, STMicroelectronics, 40 pages.
SST—"16 Mbit SPI Serial Flash"—SST25VF016B, Preliminary Specifications, 2005 Silicon Storage Technology, Inc., 28 pages.
"The I2C-Bus Specification", Version 2.1, Jan. 2000, Philips Semiconductors, 46 pages.
FBDIMM—"DDR2 Fully Buffered DIMM" 240pin FBDIMMs based on 512Mb C-die (RoHS complaint)—DDR2 SDRAM, Rev. 1.3—Sep. 2006, Samsung Electronics, 32 pages.
K9K8G08U1M—K9F4G08U0M—"K9XXG08UXM"—Preliminary Flash Memory, Samsung Electronics, 43 pages.
S70GL0IGN00 MirrorBit Flash, Publication No. S70GL0IGN00_00, Revision A, Amendment I, Issue Date Jun. 1, 2005, Spansion LLC, 83 pages.
"IEEE Standard for High-Bandwidth Memory Interface Based on Scalable Coherent Interface (SCI) Signaling Technology (RamLink)", IEEE Standards Board Mar. 19, 1996, 98 pages.
"Intel StrataFlash Wireless Memory (L18)"—28F640L18, 28F128L18, 28F256L18, Order No. 251902, Revision: 010, Aug. 2005, 106 pages.
"A Practical Guide to Serial Storage Architecture for AIX", IBM Corporation, International Technical Support Organization, First Edition (Jul. 1996), 194 pages.
"HyperTransport I/O Link Specification", Revision 3.00, Document #HTC20051222-0046-0008, 2001-2006 HyperTransport Technology Consortium, Apr. 21, 2006, 427 pages.
"HyperTransport I/O Link Specification", Revision 3.00a, Document #HTC20051222-0046-0017, 2001-2006 HyperTransport Technology Consortium, Nov. 22, 2006, 441 pages.
International Search Report mailed on Feb. 26, 2008 in connection with International Patent Application Serial No. PCT/CA2007/002092, 3 pages.
Written Opinion of the International Searching Authority mailed on Feb. 26, 2008 in connection with International Patent Application Serial No. PCT/CA2007/002092, 4 pages.
International Search Report mailed on May 20, 2008 in connection with International Patent Application Serial No. PCT/CA2008/000237, 4 pages.
Written Opinion of the International Searching Authority mailed on May 20, 2008 in connection with International Patent Application Serial No. PCT/CA2008/000237, 6 pages.
International Search Report mailed on Apr. 23, 2009 in connection with International Patent Application Serial No. PCT/CA2008/002108, 4 pages.
Written Opinion of the International Searching Authority mailed on Apr. 23, 2009 in connection with International Patent Application Serial No. PCT/CA2008/002108, 6 pages.
Extended European Search Report issued by the European Patent Office on Oct. 21, 2010 in connection with European Patent Application Serial No. 08 714 560.3, 8 pages.

* cited by examiner

METHODS AND APPARATUS FOR CLOCK SIGNAL SYNCHRONIZATION IN A CONFIGURATION OF SERIES CONNECTED SEMICONDUCTOR DEVICES

CROSS-REFERENCE TO RELATED APPLICATIONS

This application is a Continuation, claiming the benefit under 35 U.S.C. §120 of U.S. patent application Ser. No. 11/959,996 to HakJune Oh, filed on Dec. 19, 2007 now U.S. Pat. No. 7,865,756, which is an application claiming the benefit under 35 U.S.C. §119(e) of U.S. Provisional Patent Application No. 60/894,246 filed Mar. 12, 2007. The aforementioned applications are hereby incorporated by reference herein.

FIELD OF THE INVENTION

The present invention relates generally to semiconductor devices and, more particularly, to methods and apparatus for synchronizing a clock signal propagated along a series-connected configuration of such devices.

BACKGROUND

Computer-based systems typically contain semiconductor devices, such as, for example, memories. The semiconductor devices are controlled by a controller, which may form part of the central processing unit (CPU) of the computer or may be separate therefrom. The controller has an interface for communicating information with the semiconductor devices. When communication is desired with a number of semiconductor devices, various configurations are possible. In particular, a configuration of series-connected semiconductor devices may be formed by connecting semiconductor devices to one another via their interfaces in a point-to-point fashion.

SUMMARY OF THE INVENTION

According to a first broad aspect, the present invention seeks to provide a semiconductor device for use in a configuration of series-connected devices. The semiconductor device comprises an input for receiving a clock signal originating from a previous device in the configuration; an output for providing a synchronized clock signal destined for a succeeding device in the configuration; a clock synchronizer configured to produce the synchronized clock signal by processing the received clock signal and an earlier version of the synchronized clock signal; and a controller configured to adjust a parameter used by the clock synchronizer in processing the earlier version of the synchronized clock signal.

According to a second broad aspect, the present invention seeks to provide a method, which comprises receiving a clock signal originating from a previous device in a configuration of series-connected devices; producing a synchronized clock signal destined for a succeeding device in the configuration by processing the received clock signal and an earlier version of the synchronized clock signal; adjusting a parameter used by the clock synchronizer in processing the earlier version of the synchronized clock signal; and outputting the synchronized clock signal.

According to a third broad aspect, the present invention seeks to provide a system, which comprises: a configuration of series-connected semiconductor devices; and a controller configured to produce a clock signal that is transmitted to a first one of the devices in the configuration, serially propagated through other ones of the devices in the configuration and returned to the controller by a last one of the devices in the configuration, wherein a respective version of the clock signal at each of the devices in the configuration controls operation of that device. At least one of the devices in the configuration comprises a respective clock synchronizer configured to process the respective version of the clock signal for distribution to a succeeding one of the devices in the configuration or for return to the controller. The controller is further configured to adjust a parameter of at least one clock synchronizer based on processing of the clock signal transmitted to the first one of the devices in the configuration and the clock signal returned by the last one of the devices in the configuration.

According to a fourth broad aspect, the present invention seeks to provide a method, which comprises providing a first clock signal to a first device in a configuration of series-connected semiconductor devices; receiving a second clock signal from a second device in the configuration, the second clock signal corresponding to a version of the first clock signal that has undergone processing by clock synchronizer in at least one of the devices in the configuration; processing the first and second clock signals to detect a phase difference therebetween; and commanding an adjustment to the clock synchronizer in at least one of the devices in the configuration based on the phase difference.

According to a fifth broad aspect, the present invention seeks to provide a controller for a configuration of series-connected semiconductor devices. The controller comprises an output configured to provide a first clock signal to a first device in the configuration; an input configured to receive a second clock signal from a second device in the configuration, the second clock signal corresponding to a version of the first clock signal that has undergone processing by a clock synchronizer in at least one of the devices in the configuration; a detector for processing the first and second clock signals to detect a phase difference therebetween; and a synchronization controller configured to command an adjustment to the clock synchronizer in at least one of the devices in the configuration based on the phase difference detected by the detector.

These and other aspects and features of the present invention will now become apparent to those of ordinary skill in the art upon review of the following description of specific embodiments of the invention in conjunction with the accompanying drawings.

BRIEF DESCRIPTION OF THE DRAWINGS

Embodiments of the present invention will now be described, by way of example only, with reference to the attached figures, wherein.

Figure 1:
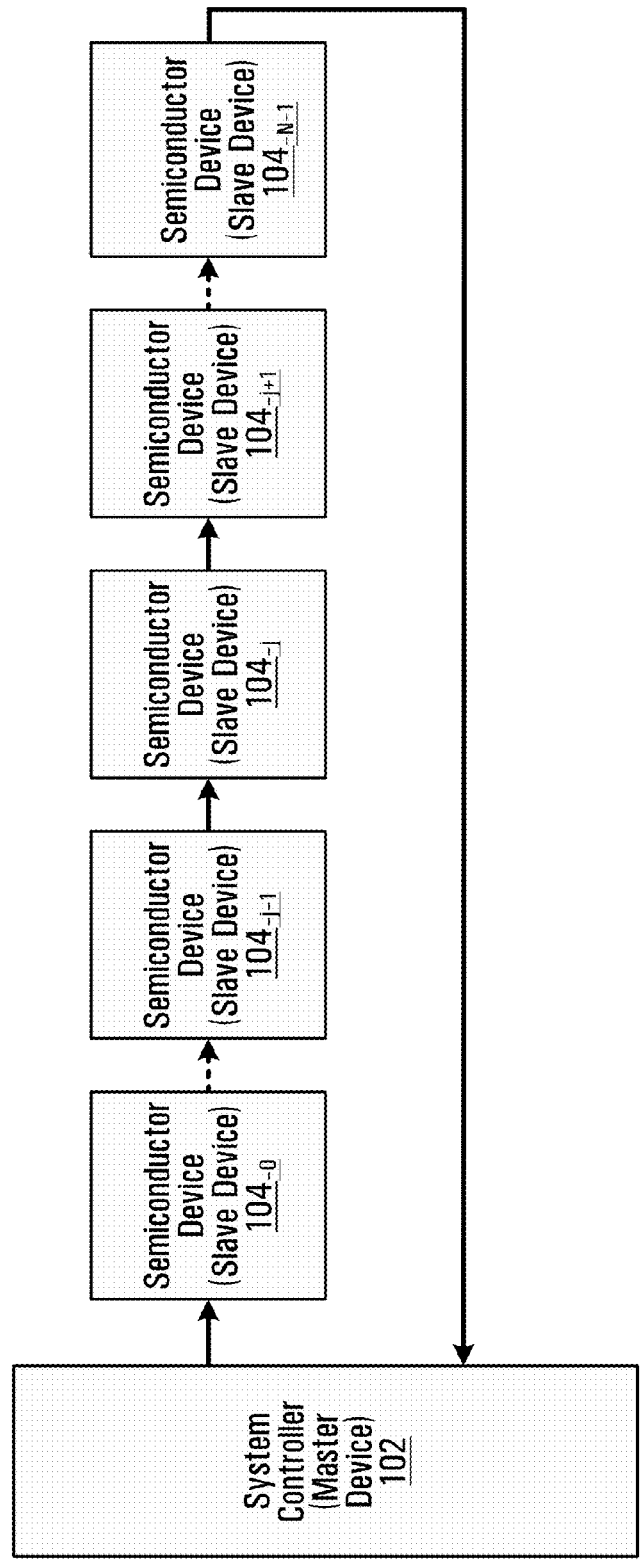
FIG. 1 is a block diagram showing a system according to an embodiment of the present invention, the system including a configuration of series-connected semiconductor devices in communication with a system controller.

It is to be expressly understood that the description and drawings are only for the purpose of illustration of certain embodiments of the invention and are an aid for understanding. They are not intended to be a definition of the limits of the invention.

DETAILED DESCRIPTION

In the following detailed description of embodiments of the present invention, reference is made to the accompanying drawings which form a part hereof, showing certain embodiments illustrative of ways in which the present invention may be practiced. These embodiments are described in sufficient detail to enable those of ordinary skill in the art to practice the present invention, and it is to be understood that other embodiments may be utilized, and that logical, electrical and other changes may be made without departing from the scope of the present invention. The following detailed description is, therefore, not to be taken in a limiting sense, and the scope of the present invention is defined by the appended claims.

Generally, the present invention relates to a configuration of series-connected semiconductor devices and to apparatus and methods for communicating with the devices in the configuration. By a "configuration of series-connected semiconductor devices" is meant that the semiconductor devices in the configuration are connected via their interfaces in point-to-point form. For example, two neighboring devices in the configuration are interconnected by the output of one device and the input of the other device. Examples of a configuration of series-connected semiconductor devices are provided in the following U.S. patent applications, the contents of which are entirely incorporated herein by reference:

Ser. No. 60/722,368, filed Sep. 30, 2005;
Ser. No. 11/324,023, filed Dec. 30, 2005;
Ser. No. 11/496,278, filed Jul. 31, 2006;
Ser. No. 11/521,734, filed Sep. 15, 2006;
Ser. No. 11/606,407, filed Nov. 29, 2006;
Ser. No. 11/771,023 filed Jun. 29, 2007; and
Ser. No. 11/771,241 filed Jun. 29, 2007.

The semiconductor devices contemplated herein can be semiconductor integrated circuit (IC) devices such as, for example, memory devices, central processing units, graphics processing units, display controller ICs, disk drive Ics and solid state drives. As far as memory devices are concerned, these may be of a type such as NAND Flash electrically erasable programmable read-only memory (EEPROM), NOR Flash EEPROM, AND Flash EEPROM, DiNOR Flash EEPROM, Serial Flash EEPROM, dynamic random access memory (DRAM), static random access memory (SRAM), read-only memory (ROM), electrically programmable read-only memory (EPROM), ferroelectric random access memory (FeRAM or FRAM), magnetoresistive random access memory (MRAM), phase change random access memory (PRAM or PCRAM), to name a few non-limiting possibilities.

Examples of semiconductor devices contemplated herein include devices that perform actions in response to signals received at one or more input ports and which are sampled at instants that depend on the behavior of a clock signal. One approach is to supply a common clock signal along a shared signal line from a system controller; this is known as a "multi-drop" clock distribution system. However, the path traveled by the clock signal along the shared signal line is slightly different for each device and leads to clock skew, especially at high operating frequencies. Moreover, the shared signal line must have sufficient power to support the load of multiple devices. Therefore, the use of a multi-drop clock distribution system is not an ideal option as the number of series-connected devices, and their operating frequency, increases.

Another approach to clock distribution is to use a DLL (delay-locked loop) or a PLL (phase-locked loop) circuit block in each device for propagating a clock signal from one device to its neighbor in the configuration, as described for example in U.S. Provisional Patent Application No. 60/868,773 filed Dec. 6, 2006 and U.S. Provisional Patent Application No. 60/890,935, filed Feb. 21, 2007, the disclosures of which are incorporated herein by reference in their entirety. However, as the number of series-connected devices increases, the parasitic delay between neighboring devices accumulates due to factors such as chip-to-chip wiring load, etc. Thus, the signals being clocked out by the last device in the configuration (and clocked back in by the system controller), may be out-of-phase with respect to the clock signal used by the system controller to drive the first device in the configuration. This phase mismatch may be so severe that it is beyond recovery by a DLL or PLL implemented in the system controller.

Thus, it will be seen that existing approaches to connecting semiconductor devices in series may impose an overly restrictive upper bound on the total number of devices that can be connected in this way and/or on their operating frequency. This may limit the ability of configurations of series-connected devices to compete with their parallel counterparts. A need therefore exists in the industry to improve the synchronization of a clock signal propagated from device to device in a configuration of series-connected semiconductor devices.

FIG. 1 shows a system according to a non-limiting embodiment of the present invention. Referring to FIG. 1, a system controller 102 communicates with a configuration of N devices that are connected in series. In the illustrated embodiment, the configuration includes a "first" semiconductor device 104-0, - - - , an intermediate semiconductor device 104-$j$-1, another intermediate semiconductor device 104-$j$, a further intermediate semiconductor device 104-$j$+1, - - - , and a "last" semiconductor device 104-N-1, N being an integer, where $1 \leq j \leq N-2$. It should be appreciated that the number of semiconductor devices 104-0 - - - N-1 in the configuration is not particularly limited.

The semiconductor devices 104-0 - - - N-1 can be semiconductor devices, such as memory devices, for example. In the case where the semiconductor devices 104-0 - - - N-1 are memory devices, the system controller 102 is implemented as a memory controller. It should be understood that the system controller 102 can itself be a semiconductor device.

In the system shown in FIG. 1, during an initialization procedure, the semiconductor devices of the configuration are assigned device addresses (or device identifiers) by the system controller 102. For example, devices addresses of consecutive numbers from low to high are generated and assigned to the semiconductor devices 104-0 - - - 104-N-1. Each of the semiconductor devices 104-0 - - - 104-N-1 has its own address register (not shown) and the address register holds the assigned device address.

After the device addresses are assigned to the semiconductor devices 104-0 - - - 104-N-1, and in order to control operation of the devices of the configuration, the system controller 102 sends an access command and other information to the first semiconductor device 104-0 thereof, such operation including, for example, device address recognition and data processing. Generally speaking, one example of data processing is to access a memory (not shown) included in each of the devices. For example, in the case of an access command being a write command, provided data is written into the memory of the target (or destined) device in accordance with the device address. In the case of an access command being a read command, the data of the memory is read in accordance with the memory address and the read data is transmitted to another device and forwarded to the system controller 102. Examples of the device address assignment, the device address recognition and the data accessing are provided in the following U.S. patent applications, the contents of which are entirely incorporated herein by reference:

U.S. Provisional Patent Application No. 60/787,710, filed Mar. 28, 2006;
U.S. Provisional Patent Application No. 60/802,645, filed May 23, 2006; and
U.S. Provisional Patent Application No. 60/868,773 filed Dec. 6, 2006.

In the system of FIG. 1, the semiconductor devices 104-0 - - - N-1 are all similarly configured. The behavior of the devices 104-0 - - - N-1 is synchronized by clocks (not shown) provided thereto by the master device 102. For example, the clocks can be provided in either a common clock fashion or a clock transfer fashion, as described later.

Figure 2A:
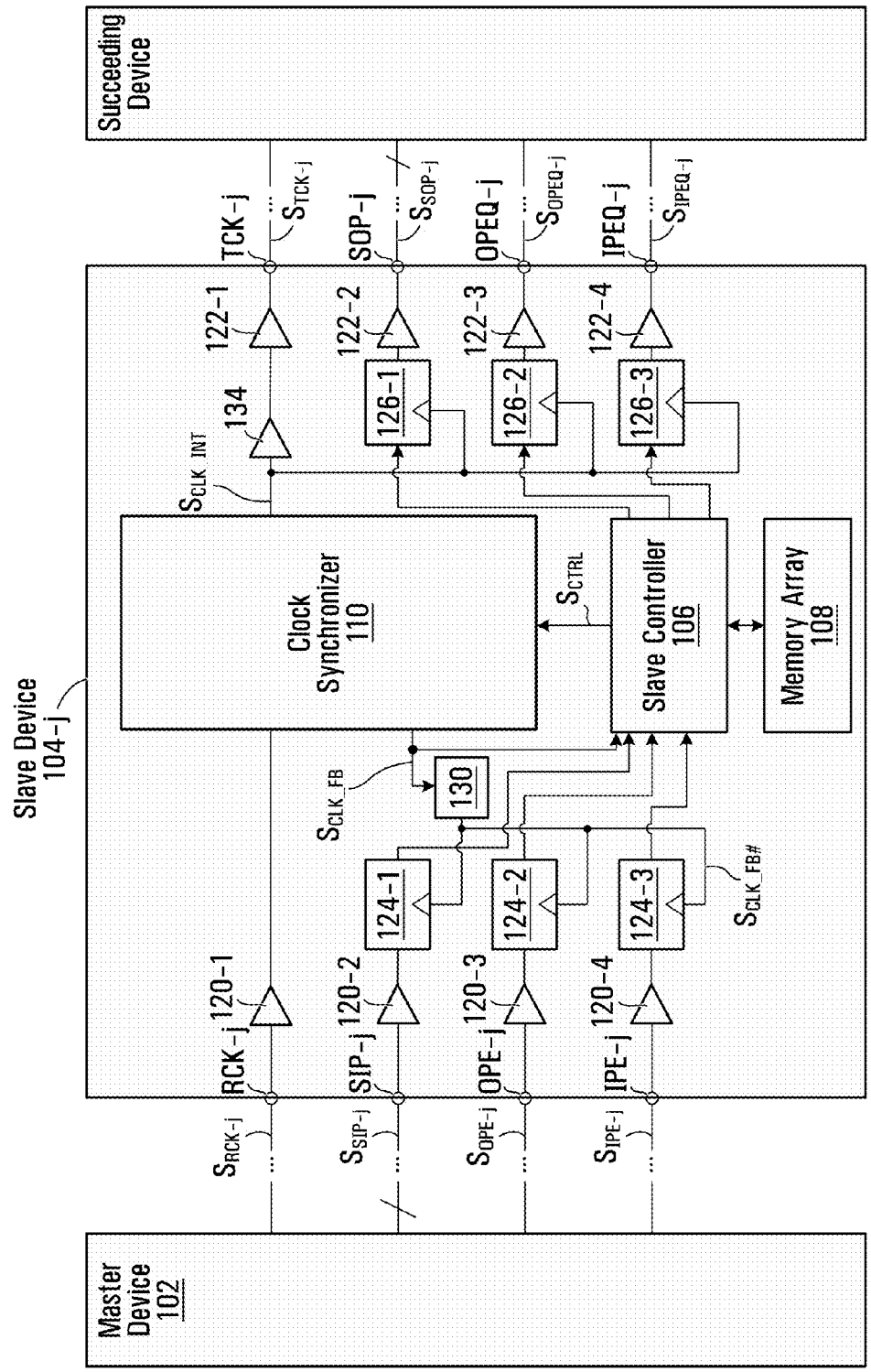
FIG. 2A is a block diagram showing details of one of the devices of FIG. 1, in accordance with a non-limiting example embodiment of the present invention.

FIG. 2A shows details of the system of FIG. 1. Referring to FIGS. 1 and 2A, the system controller 102 (hereinafter referred to as a "master device") is in communication with semiconductor device 104-$j$ (hereinafter referred to as a "slave device"). In the case where slave device 104-$j$ is a memory device, the master device 102 may be implemented as a memory controller.

Slave device 104-$j$ includes a slave controller 106, a memory array 108, a clock synchronizer 110 and an interface comprising a plurality of ports. As will be described in greater detail later on, the slave controller 106 performs various control and process functions with access to the memory array 108 in response to signals arriving via input ports of the interface, and provides output signals via output ports of the interface. The slave controller 106 also provides a control signal $S_{CTRL}$ to the clock synchronizer 110. The control signal $S_{CTRL}$ is generated in response to commands received from the master device 102 via the input ports of the interface of slave device 104-$j$.

The interface of slave device 104-$j$ includes a serial input port (hereinafter, the "SIP-j port") and a serial output port (hereinafter, the "SOP-j port"). The SIP-j port is used to transfer information (e.g., command, address and data information) carried by an input information signal $S_{SIP-j}$ into slave device 104-$j$; some of this information may be destined for the slave controller 106 and some may be destined for the memory array 108. The SOP-j port is used to transfer or relay information (e.g., command, address and data information) from slave device 104-$j$ onto an output information signal $S_{SOP-j}$, with some of this information possibly having originated from the memory array 108. It should be understood that the SIP-j and SOP-j may be single-bit-width or multi-bit-width ports. That is to say, the SIP-j and SOP-j ports may each carry one, two, four, eight or any other conceivable number of signal lines.

In addition, the interface of slave device 104-$j$ includes an input port enable input port (hereinafter, the "IPE-j port") and an output port enable input port (hereinafter, the "OPE-j port"). The IPE-j port receives an input port enable signal $S_{IPE-j}$. The input port enable signal $S_{IPE-j}$ is used by slave device 104-$j$ to enable the SIP-j port such that when the input port enable signal $S_{IPE-j}$ is asserted, information is input to slave device 104-$j$ via the SIP-j port. Likewise, the OPE-j port receives an output port enable signal $S_{OPE-j}$. The output port enable signal $S_{OPE-j}$ is used by slave device 104-$j$ to enable the SOP-j port such that when the output port enable signal $S_{OPE-j}$ is asserted, information is output from slave device 104-$j$ via the SOP-j port.

In addition, the interface of slave device 104-$j$ includes an input port enable echo output port (hereinafter, the "IPEQ-j port") and an output port enable echo output port (hereinafter, the "OPEQ-j port"). The IPEQ-j and OPEQ-j ports output signals $S_{IPEQ-j}$ and $S_{OPEQ-j}$, respectively, from slave device 104-$j$. The signals $S_{IPEQ-j}$ and $S_{OPEQ-j}$ are propagated versions of the input port enable signal $S_{IPE-j}$ and the output port enable signal $S_{OPE-j}$, respectively.

In addition, the interface of slave device 104-$j$ includes a clock input port (hereinafter, the "RCK-j port"). The RCK-j port receives an input clock signal $S_{RCK-j}$, which is used to control latching of the signals present at the SIP-j port (which can have a width of one or several signal lines) into registers internal to slave device 104-j, as well as latching of signals onto the SOP-j port from registers internal to slave device 104-j. The input clock signal $S_{RCK\text{-}j}$ is also used to control latching of the signals present at the IPE-j and OPE-j ports into registers internal to slave device 104-j and onto the IPEQ-j and OPE-j ports, respectively.

In addition, the interface of slave device 104-j includes a clock output port (hereinafter, the "TCK-j port"). The TCK-j port provides an output clock signal $S_{TCK\text{-}j}$, which is propagated to a succeeding device, which can be another slave device or the master device 102, for example. The output clock signal $S_{TCK\text{-}j}$ originates from the clock synchronizer 110, which receives and a buffered version of the input clock signal $S_{RCK\text{-}j}$ from the RCK-j port together with the control signal $S_{CTRL}$ from the slave controller 106.

In operation, the input port enable signal $S_{IPE\text{-}j}$ controls the "beginning" and the "end" of a window for valid information carried by the input information signal $S_{SIP\text{-}j}$, which is synchronous with the input clock signal $S_{RCK\text{-}j}$. The output port enable signal $S_{OPE\text{-}j}$ controls the "beginning" and the "end" of a window for valid information carried by the output information signal $S_{SOP\text{-}j}$, which is synchronous with the output clock signal $S_{TCK\text{-}j}$.

In addition, the interface of slave device 104-j may include a chip select port (not shown), which receives a chip select signal that enables operation of slave device 104-j and possibly other slave devices concurrently. A reset port (not shown) may also be provided, for the purposes of carrying a reset signal from the master device 102 for resetting one or more functions of the slave device 104-j. Those skilled in the art will appreciate that in a specific non-limiting configuration, the chip select signal may be provided in a multi-drop manner, and that the reset signal may be provided in a point-to-point fashion. Other configurations are of course possible without departing from the scope of the present invention.

Those skilled in the art will also appreciate that other components may be provided in slave device 104-j without departing from the scope of the invention, such as buffers, phase shifters, other logic sub-circuits, etc., depending on the clock rate type (e.g., single data rate versus double data rate), the clock response type (e.g., source-synchronous versus offset) and various other aspects of the functionality of slave device 104-j.

For example, in the illustrated embodiment, slave device 104-j includes a plurality of input buffers 120-1, 120-2, 120-3 and 120-4 connected to the RCK-j, SIP-j, OPE-j and IPE-j ports, respectively, and a plurality of output buffers 122-1, 122-2, 122-3 and 122-4 connected to the TCK-j, SOP-j, OPEQ-j and IPEQ-j ports, respectively.

Also, on the input path side, slave device 104-j may include a first set of D-type flip-flops 124-1, 124-2, 124-3 (or other latching circuits) for latching the non-clock input signals in synchronism with a clock signal, which can be the input clock signal $S_{RCK\text{-}j}$ or (as illustrated) a feedback clock signal $S_{CLK\_FB}$ obtained from the clock synchronizer 110. In other embodiments, the clock signal used to drive the D-type flip-flops 124-1, 124-2, 124-3 may be obtained from an internal clock driving scheme derived from the input clock signal $S_{RCK\text{-}j}$ or the feedback clock signal $S_{CLK\_FB}$. It is contemplated that a wide variety of internal clock driving schemes, including clock trees in various configurations, can be used.

In the embodiment being described here, the clock response type of slave device 104-j is assumed to be edge-aligned source-synchronous, and thus the feedback clock signal $S_{CLK\_FB}$ passes through a 180° phase shifter 130 before actually being provided to the D-type flip-flops 124-1, 124-2, 124-3. This is because source-synchronous clocking provides zero-degree) (0°) phase alignment between clock signals and data. If the clock response type is different (e.g., center-aligned source-synchronous), then the amount of phase shift to be applied to the feedback clock signal $S_{CLK\_FB}$ may correspondingly be different. Also in the embodiment being described here, the clock rate type of slave device 104-j is single data rate (SDR); if a double data rate (DDR) clock rate type is used, a 90° phase shifter can replace the phase shifter 130.

The non-clock input signals output by the D-type flip-flops 124-1, 124-2, 124-3 are provided to the slave controller 106 for further processing. In response, the slave controller 106 produces non-clock output signals that are provided to a second set of D-type flip-flops 126-1, 126-2, 126-3 (or other latching circuits) on the output path side. The D-type flip-flops 126-1, 126-2, 126-3 are operable to latch the non-clock output signals in synchronism with a clock signal, which can be an intermediate output clock signal $S_{CLK\_INT}$ obtained from the clock synchronizer 110. A buffer element 134 represents a matching delay model for the second set of D-type flip-flops 126-1, 126-2, 126-3, and is placed between the clock synchronizer 110 and the output buffer 122-1 connected to the TCK-j port.

Figure 2B:
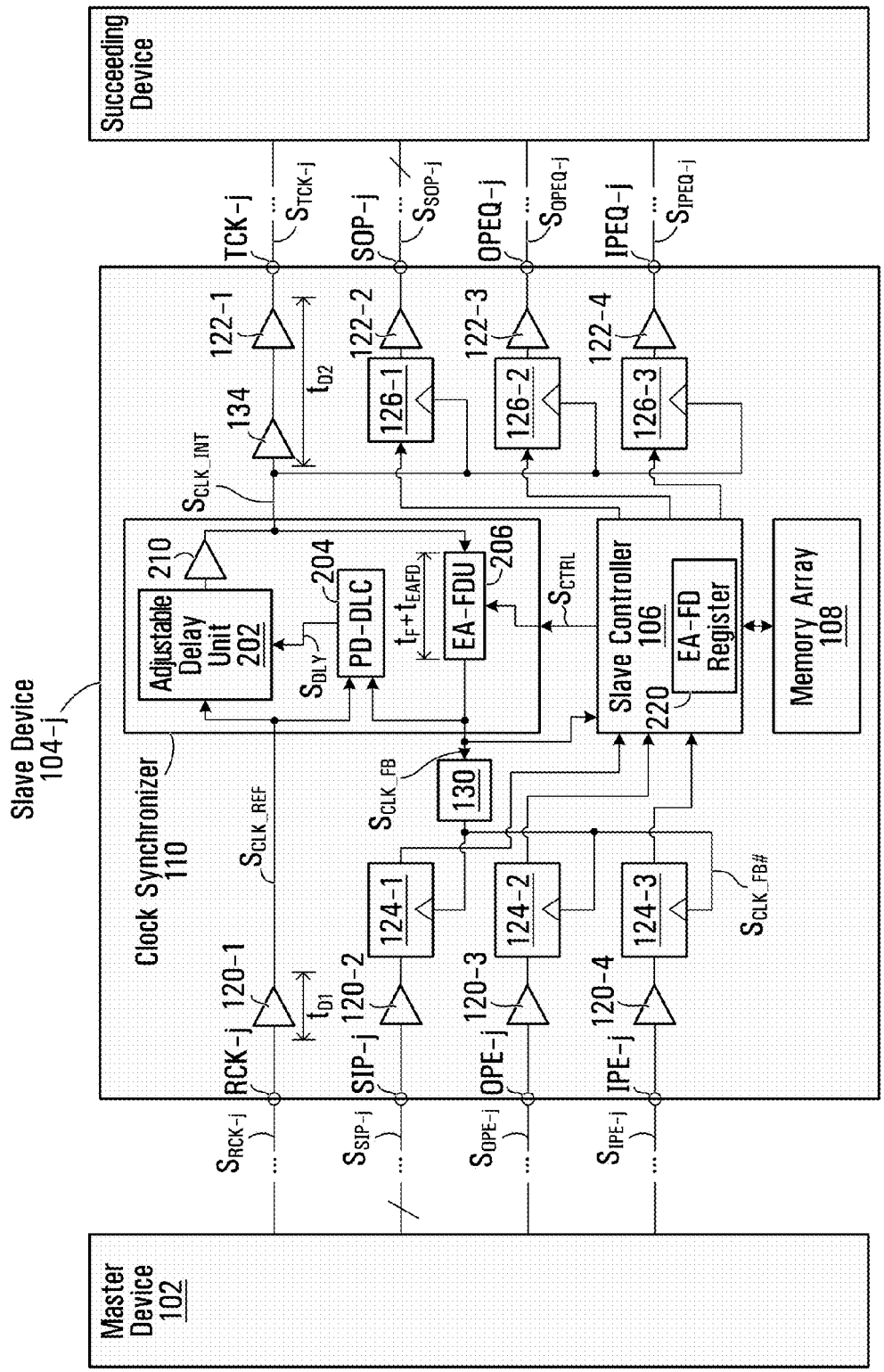
FIG. 2B is a block diagram showing further details of one of the devices shown in FIG. 1, including an adjustable delay unit and an externally adjustable feedback delay unit (EA-FDU), in accordance with a non-limiting example embodiment of the present invention.

FIG. 2B shows further details of the slave device of FIG. 2A. Referring to FIGS. 1, 2A and 2B, the clock synchronizer 110 of the slave device 104 implements an "externally adjustable" delay-locked loop (EA-DLL). To this end, the clock synchronizer 110 comprises an adjustable delay unit 202, a phase detector and delay line controller (PD-DLC) 204 and an externally adjustable feedback delay unit (EA-FDU) 206.

The adjustable delay unit 202 has an input port for receiving a reference clock signal $S_{CLK\_REF}$, which is a signal output by the input buffer 120-1 connected to the RCK-j port. In other words, the reference clock signal $S_{CLK\_REF}$ corresponds to the input clock signal $S_{RCK\text{-}j}$ after having passed through the input buffer 120-1. The adjustable delay unit 202 applies a controllable delay to the reference clock signal $S_{CLK\_REF}$ in order to produce the intermediate clock signal $S_{CLK\_INT}$, which appears at an output port of the adjustable delay unit 202. A buffer 210 can be used to handle heavy loading of the intermediate clock signal $S_{CLK\_INT}$.

The adjustable delay unit 202 can be implemented in a variety of ways, including a digital delay line or an analog delay line, either of which can be single-stage or multi-stage. For example, in a multi-stage delay unit, a multiplicity of cascaded delay elements can be provided, to each of which is connected a switch that can be driven by a counter in order to switch the output signal of the respective delay element through to the output port of the adjustable delay unit 202. The number of delay elements that are activated between the input and output ports of the delay unit determines the instantaneous delay applied by the adjustable delay unit 202. Other implementations are of course possible without departing from the scope of the present invention.

Control of the amount of delay applied by the adjustable delay unit 202 is provided by a command signal $S_{DLY}$ received at a control port of the adjustable delay unit 202. The command signal $S_{DLY}$ is supplied by the PD-DLC 204 via an output port thereof. The PD-DLC 204 is operative to generate the command signal $S_{DLY}$ based on two signals received at respective input ports. The first signal is the reference clock signal $S_{CLK\_REF}$ that is also fed to the input port of the adjustable delay unit 202. The second signal is the feedback clock signal $S_{CLK\_FB}$ that is output from the clock synchronizer 110.

The feedback clock signal $S_{CLK\_FB}$ is supplied by the EA-FDU 206 via an output port thereof. The EA-FDU 206 also has an input port for receiving the intermediate output clock signal $S_{CLK\_INT}$ that is also fed to the buffer element 134. The EA-FDU 206 also comprises a control port for receiving the control signal $S_{CTRL}$ from the slave controller 106. The EA-FDU 206 is operative to generate the feedback clock signal $S_{CLK\_FB}$ by applying a delay to the intermediate output clock signal $S_{CLK\_INT}$, such delay being a function of the control signal $S_{CTRL}$. The current value of the delay being applied by the EA-FDU 206 is an example of a parameter that can be controlled by the slave controller 106.

In operation, the PD-DLC 204 detects a phase difference between the feedback clock signal $S_{CLK\_FB}$ and the reference clock signal $S_{CLK\_REF}$, and outputs the command signal $S_{DLY}$ based on the detected phase difference. Thus, the output of the PD-DLC 204 will be zero when the phase of the feedback clock signal $S_{CLK\_FB}$ corresponds to the phase of the reference clock signal $S_{CLK\_REF}$. At this point, the clock synchronizer 110 has achieved a state of "delay lock". In such a state, it will be observed that the feedback clock signal $S_{CLK\_FB}$ will be a delayed version of the intermediate clock signal $S_{CLK\_INT}$. In other words, the intermediate clock signal $S_{CLK\_INT}$ is an earlier version of the feedback clock signal $S_{CLK\_FB}$, which will have the same phase as the reference clock signal $S_{CLK\_REF}$ during a state of delay lock.

The amount of time by which the intermediate clock signal $S_{CLK\_INT}$ is ahead of the reference clock signal $S_{CLK\_REF}$ (namely, the amount of lead time) will correspond to the current value of the delay being applied by the EA-FDU 206. This delay can be broken down into two components, namely a fixed component $t_F$ and a variable component $t_{EAFD}$. The fixed component $t_F$, which can be determined during a design phase based on the result of simulations, approximates the propagation delay of the input clock signal $S_{RCK-j}$ through slave device 104-j (i.e., from the RCK-j port to the clock synchronizer 110, and from the clock synchronizer 110 to the TCK-j port). Specifically, assuming the variable component $t_{EAFD}$ to be zero, the fixed component $t_F$ will result in the clock synchronizer 110 producing the feedback clock signal $S_{CLK\_FB}$ at a phase that is advanced relative to the phase of the intermediate output clock signal $S_{CLK\_INT}$ (and also relative to the phase of the reference clock signal $S_{CLK\_REF}$) by an amount corresponding to the approximated propagation delay through slave device 104-j. As a result, the phase of the output clock signal $S_{TCK-j}$, after the effects of propagation through slave device 104-j, will be approximately aligned with the phase of the input clock signal $S_{RCK-j}$.

To take a specific example, consider that the propagation delay through each of the input buffers 120-1, 120-2, 120-3, 120-4 is $t_{D1}$ and that the propagation delay through each of the output buffers 122-1, 122-2, 122-3, 122-4 is $t_{D2}$. The fixed component of the delay being applied by the EA-FDU 206 may therefore be set to $t_F = t_{D1} + t_{D2}$ during the design phase. Of course, other sources of propagation delay through slave device 104-j may be identified during the design phase and accounted for by the fixed component $t_F$.

Figure 3A:
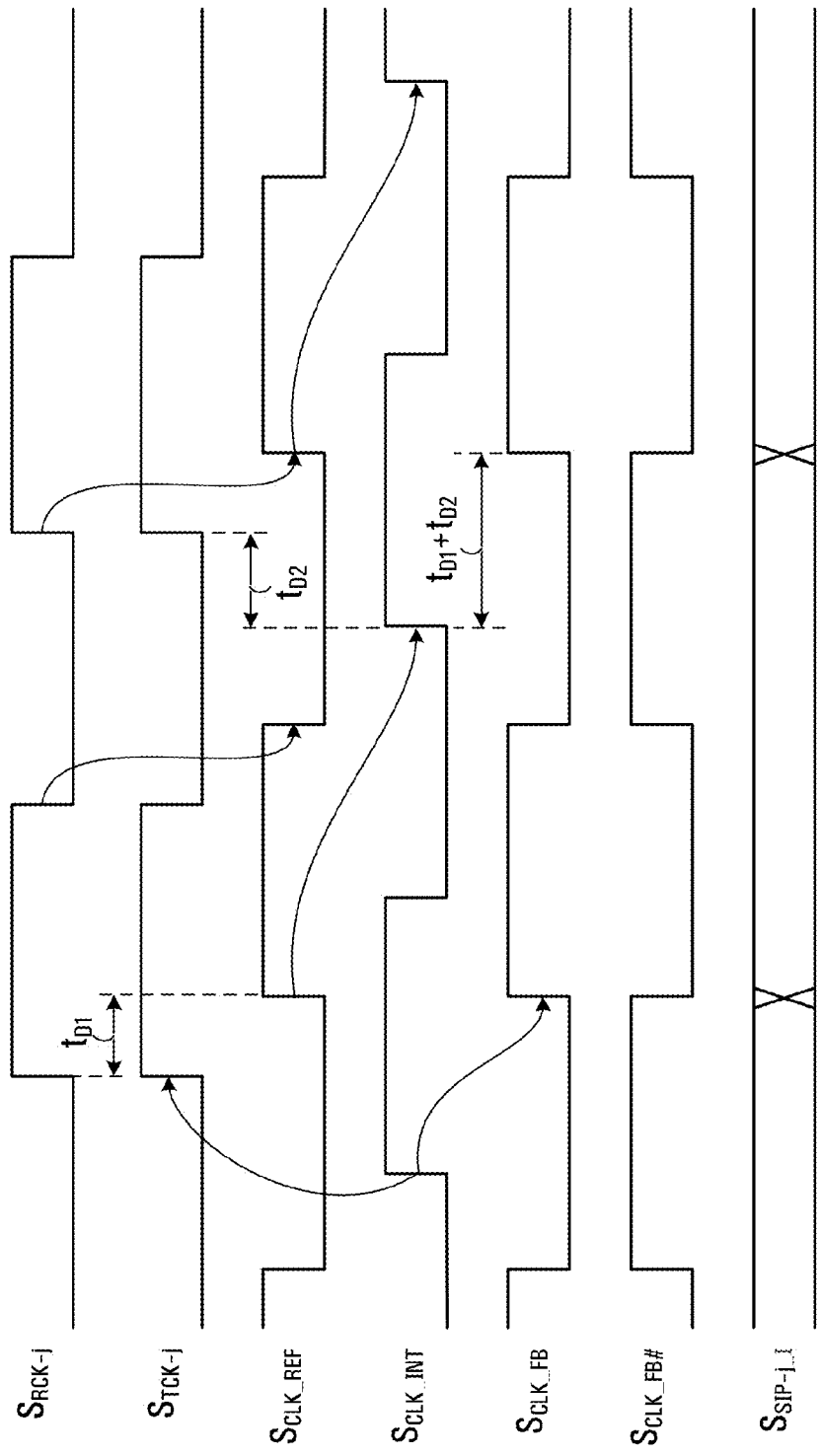
FIG. 3A is a timing diagram showing progression of certain signals within one of the devices shown in FIG. 1, when considering a fixed component of a delay applied by the EA-FDU.

FIG. 3A is a timing diagram illustrating the effect of the fixed component of the delay being applied by the EA-FDU 206 of FIG. 2B (in this case having been set to $t_F = t_{D1} + t_{D2}$). Referring to FIGS. 2B and 3A, specifically, shown are the input clock signal $S_{RCK-j}$, the output clock signal $S_{TCK-j}$, the reference clock signal $S_{CLK\_REF}$, the intermediate clock signal $S_{CLK\_INT}$, the feedback clock signal $S_{CLK\_FB}$ and the output of the 180-degree phase shifter 130, denoted $S_{CLK\_FB\#}$. Also provided for comparison purposes is a version of the input information signal $S_{SIP-j}$ at its exit from the input buffer 120-1 connected to the SIP-j port; this signal is denoted $S_{SIP-j\_I}$. It can be seen that the phase of the output clock signal $S_{TCK-j}$ is aligned with the phase of the input clock signal $S_{RCK-j}$. Of course, this alignment may be only approximate, depending on how well the propagation delay through the input buffers 120-1, 120-2, 120-3, 120-4 and output buffers 122-1, 122-2, 122-3, 122-4 has been approximated during the design phase. One should appreciate that the timing diagram would exhibit different features for a different clock rate type or clock response type.

Returning now to FIG. 2B, and in accordance with an embodiment of the present invention, the variable component $t_{EAFD}$ of the delay being applied by the EA-FDU 206 is manipulated in order to fine tune the phase of the output clock signal $S_{TCK-j}$, based on commands received from the master device 102. These commands are interpreted by the slave controller 106 and translated into the control signal $S_{CTRL}$ fed to the control port of the EA-FDU 206.

As adjustments are made to the variable component $t_{EAFD}$, the feedback clock signal $S_{CLK\_FB}$ will undergo a corresponding time shift. The PD-DLC 204 detects a new phase difference between the (now shifted) feedback clock signal $S_{CLK\_FB}$ and the reference clock signal $S_{CLK\_REF}$, and outputs a new instantiation of the command signal $S_{DLY}$ based on the detected phase difference. This new instantiation of the command signal $S_{DLY}$ will be non-zero (either positive or negative), in response to which the adjustable delay unit 202 adjusts the current value of the delay being applied to the reference clock signal $S_{CLK\_REF}$, thereby producing a shifted version of the intermediate clock signal $S_{CLK\_INT}$ at the output port of the adjustable delay unit 202. This shifted version of the intermediate clock signal $S_{CLK\_INT}$ is returned to the EA-FDU 206, which produces a further shifted version of the feedback clock signal $S_{CLK\_FB}$. The above process continues until a state of delay lock is achieved, at which point the phase of the feedback clock signal $S_{CLK\_FB}$ corresponds to the phase of the reference clock signal $S_{CLK\_REF}$.

Figure 3B:
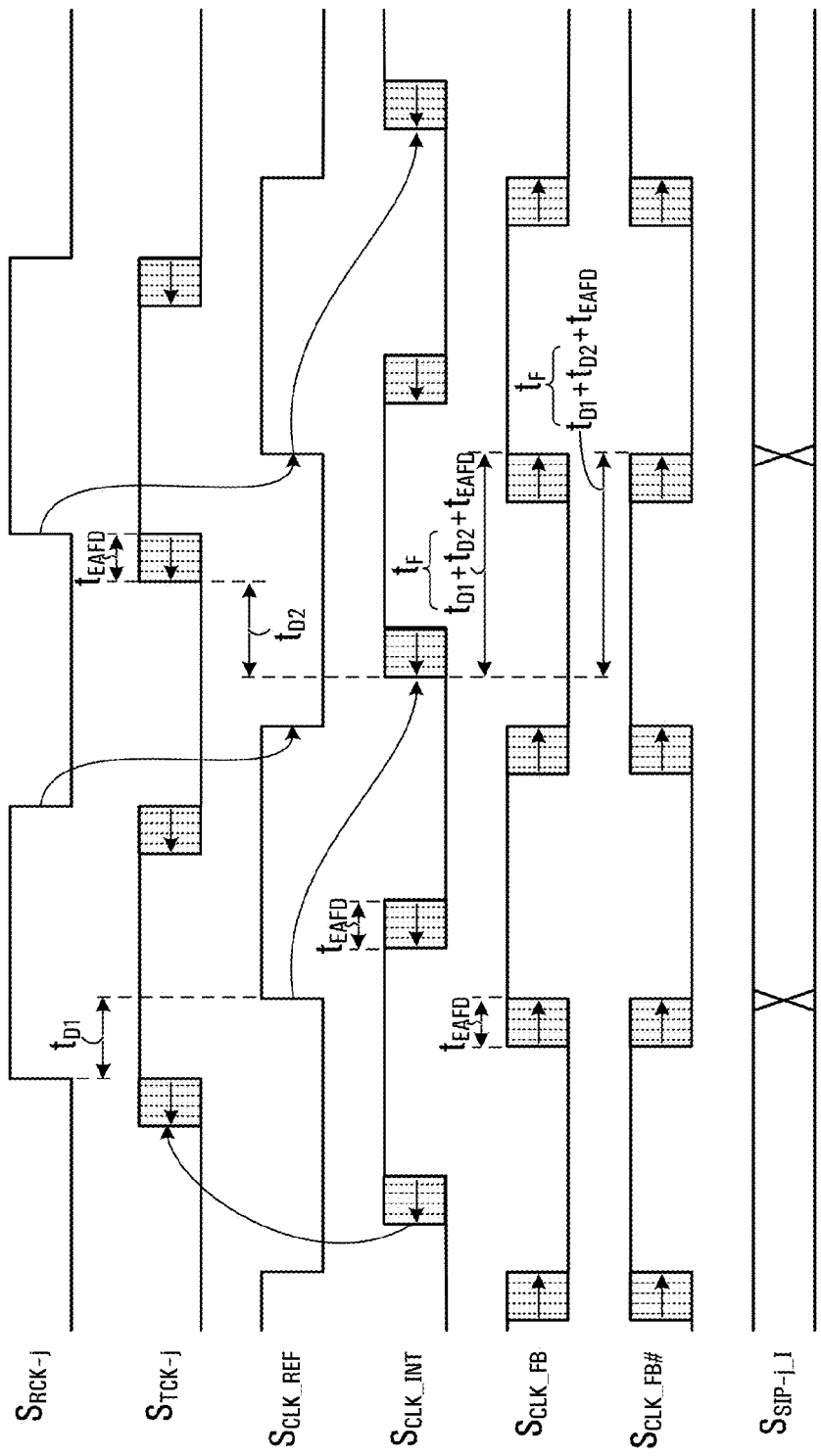
FIG. 3B is a timing diagram showing progression of the same signals as in FIG. 3A, but considering both the fixed component and a variable component of the delay applied by the EA-FDU.

With reference to FIG. 3B, there is shown a timing diagram similar to that of FIG. 3A, but illustrating the additional effect of the variable component $t_{EAFD}$. It can be seen that the current value of the delay being applied by the EA-FDU 206 (namely, $t_F + t_{EAFD} = t_{D1} + t_{D2} + t_{EAFD}$) causes the phase of the output clock signal $S_{TCK-j}$ to no longer be aligned with the phase of the input clock signal $S_{RCK-j}$. The amount of misalignment depends on the variable component $t_{EAFD}$ and is deliberately caused for reasons that may include accounting for parasitic delays between slave device 104-j and other devices (not shown) connected thereto in a serial fashion.

Of course, while in the present example, the variable component $t_{EAFD}$ is taken to be a positive value, which causes the output clock signal $S_{TCK-j}$ to lead the input clock signal $S_{RCK-j}$, one will appreciate that the variable component $t_{EAFD}$ can be a negative value, which causes the output clock signal $S_{TCK-j}$ to lag the input clock signal $S_{RCK-j}$.

It should also be appreciated that the flexibility provided by the control signal $S_{CTRL}$ allows one to relax the requirements of the design phase of the clock synchronizer 110. For example, during the design phase, one can initialize the fixed component $t_F$ to merely a rough estimate of $t_{D1} + t_{D2}$, and use the control signal $S_{CTRL}$ to adjust the variable component $t_{EAFD}$ until any errors are compensated for, in addition to providing the requisite phase lag or lead between the output clock signal $S_{TCK-j}$ and the input clock signal $S_{RCK-j}$. In fact, one can even reduce the fixed component $t_F$ to zero and use an estimate of $t_{D1} + t_{D2}$ as an initial value for the variable component $t_{EAFD}$ from which further adjustments can be made by virtue of the control signal $S_{CTRL}$.

It is recalled that the control signal $S_{CTRL}$ is provided by the slave controller 106 and is generated based on commands received from the master device 102. More specifically, and in an example referring to FIG. 2B, the slave controller 106 may comprise an externally adjustable feedback delay (EA-FD) register 220 that is capable of being written to by the master device 102. In a specific embodiment, the EA-FD register 220 contains a bit pattern that specifies a desired delay adjustment relative to the current value of the delay being applied by the EA-FDU 206. The slave controller 106 is configured to issue the control signal $S_{CTRL}$ indicative of the contents of the EA-FD register 220. In particular, the control signal $S_{CTRL}$ is formatted such that, when interpreted by the EA-FDU 206 upon receipt at its control port, the control signal $S_{CTRL}$ will cause a corresponding delay adjustment relative to the current value of the delay being applied to the intermediate clock signal $S_{CLK\_INT}$. The delay adjustment can be specified in a number of "delay units", where the duration of one delay unit is a design parameter that can be made as large or as small as necessary to meet operational requirements.

Various bit patterns that can be contained in the EA-FD register 220, and the possible significance of each such bit pattern in terms of the desired delay adjustment relative to the current value of the delay being applied by the EA-FDU 206, is provided in Table 1 below:

TABLE 1

| | | Bit pattern written, to EA-FD register 220 in the slave controller 106 | | | | | | | |
|---|---|---|---|---|---|---|---|---|---|
| Desired delay adjustment | | Bit 7 | Bit 6 | Bit 5 | Bit 4 | Bit 3 | Bit 2 | Bit 1 | Bit 0 |
| Delay Increment (+) | +1 delay unit | 0 | 0 | Don't Care | | | 0 | 0 | 0 |
| | +2 delay units | | | | | | 0 | 0 | 1 |
| | +4 delay units | | | | | | 0 | 1 | 0 |
| | +8 delay units | | | | | | 0 | 1 | 1 |
| | Maximum Delay | | | | | | 1 | 1 | 1 |
| | Reserved | | | | | | All Other Combinations | | |
| Delay Decrement (−) | −1 delay unit | 0 | 1 | 0 | 0 | 0 | Don't Care | | |
| | −2 delay units | | | 0 | 0 | 1 | | | |
| | −4 delay units | | | 0 | 1 | 0 | | | |
| | −8 delay units | | | 0 | 1 | 1 | | | |
| | Minimum Delay | | | 1 | 1 | 1 | | | |
| | Reserved | | | All Other Combinations | | | | | |
| Reset | Reset To Default | 1 | 0 | Don't Care | | | | | |
| | Reserved | 1 | 1 | | | | | | |

It should be understood that Table 1 shows example bit pattern definitions merely for illustrative purposes. The bit patterns can be easily modified and/or expanded if finer or coarser granularity for the desired delay adjustment is required.

Those skilled in the art will appreciate that the slave controller 106 may be designed to clear the EA-FD register 220 immediately after reading it, or may be designed to read the EA-FD register 220 only once after each time that it is written to by the master device 102.

It is recalled that the slave controller 106 writes to the EA-FD register 220 upon receipt and recognition of a command from the master device 102. Such a command, hereinafter referred to as a "Write EA-FDU" command, can be signaled by controlling the signals appearing on the SIP-j and IPE-j ports. More specifically, assuming that the signal at the IPE-j port is kept asserted, an example of a "Write EA-FDU" command may have the following 3-byte format:

| Command | 1st Byte | 2nd Byte | 3rd Byte |
|---|---|---|---|
| Write EA-FDU | "device address" | B0h | DATA |

In the above example format, the first byte ("device address") identifies slave device 104-j, either on an individual basis or as part of a group. In other words, slave device 104-j has one or more addresses of which it is aware. These addresses may be learned during an initialization procedure. One of these addresses may be a "specific address", which is unique with respect to other slave devices, while another one of these addresses may be a "common address", which is commonly recognized by slave device 104-j and one (or more, or all) other slave device(s) (if any) connected to the master device 102. By recognizing its own address (or one of its own addresses) in the received information, the slave controller 106 will expect to receive further bytes of a command, and will expect to have to respond thereto.

In the above example format, the second byte (B0h) is a "further byte" of the "Write EA-FDU" command, and represents a hexadecimal value that indicates that the command is a "Write EA-FDU" command and not some other command. This is to help distinguish this command from other commands to which the slave controller 106 may be configured to respond. Of course, the precise hexadecimal value of the "Write EA-FDU" command is a design parameter and does not have any significance in this example other than to serve an illustrative purpose.

Figure 4A:
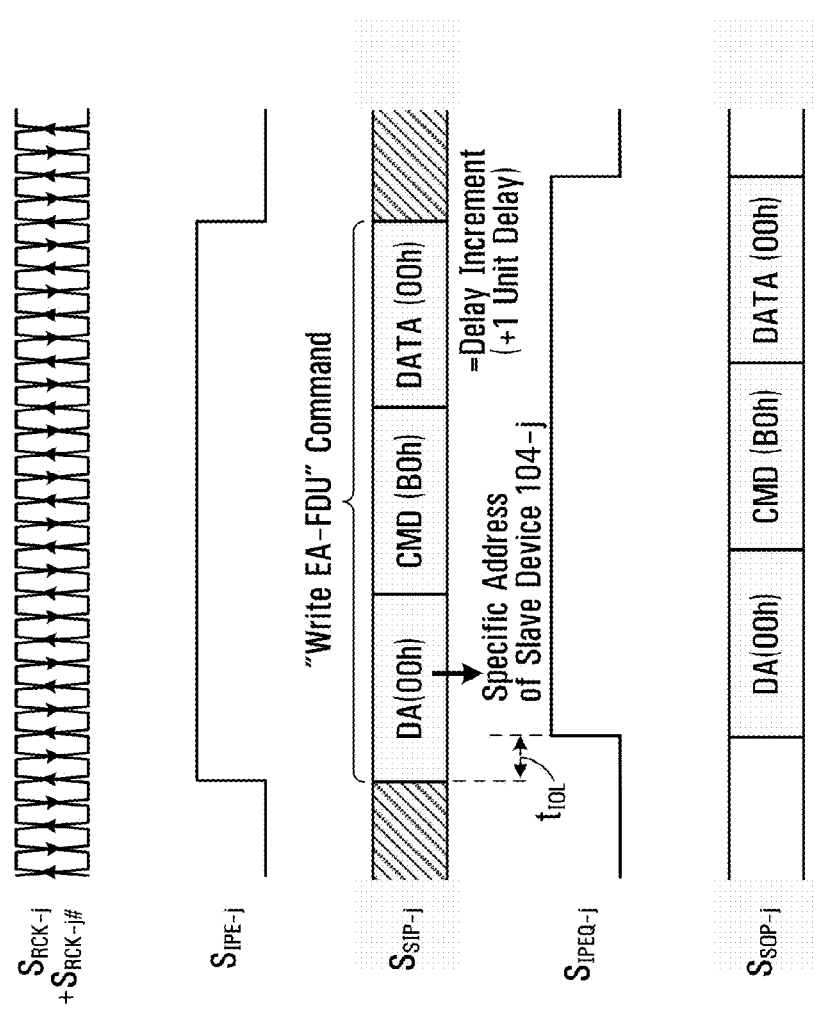
FIG. 4A is a timing diagram showing progression of certain signals within one of the devices shown in FIG. 1, in a scenario where the system controller issues a write command specifically targeting the device and carrying information that impacts the delay applied by the EA-FDU.
Figure 4B:
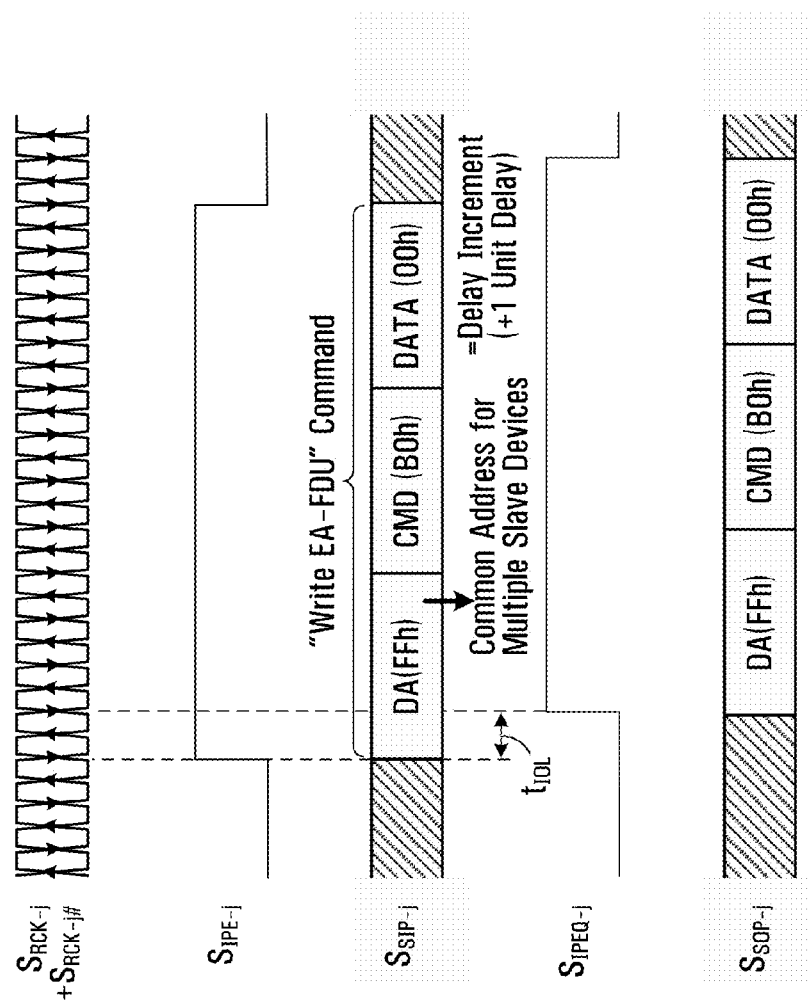
FIG. 4B is a timing diagram showing progression of the same signals as in FIG. 4A, but in a scenario where the command is broadcast by the system controller.

In the above example format, the third byte (DATA) represents the bit pattern to be written to the EA-FD register 220, which can be in accordance with the above table. Assume now that slave device 104-j has a specific address of "00h" and a common address of "FFh". FIGS. 4A and 4B each show a basic timing diagram for the "Write EA-FDU" command, in the case where the desired delay adjustment relative to the current value of the delay being applied by the EA-FDU 206 is an increment of +1 delay unit. In the case of FIG. 4A, the "Write EA-FDU" command is destined specifically for slave device 104-j, while in the case of FIG. 4B, slave device 104-j is but one of several possible intended recipients of the "Write EA-FDU" command.

In these timing diagrams, a differential clocking scheme is shown by way of non-limiting example, using a pair of input clock signals $S_{RCK\text{-}j} + S_{RCK\text{-}j\#}$. Also, a double data rate (DDR) approach is shown by way of non-limiting example. Furthermore, input-to-output latency (or "flow-through latency", denoted $t_{IOL}$) corresponds to one (1) clock cycle (or two (2) DDR cycles) in this specific example. Of course, in other implementations, a single-ended clocking scheme may be used, as well as a different clock rate type and port width.

Figure 5:
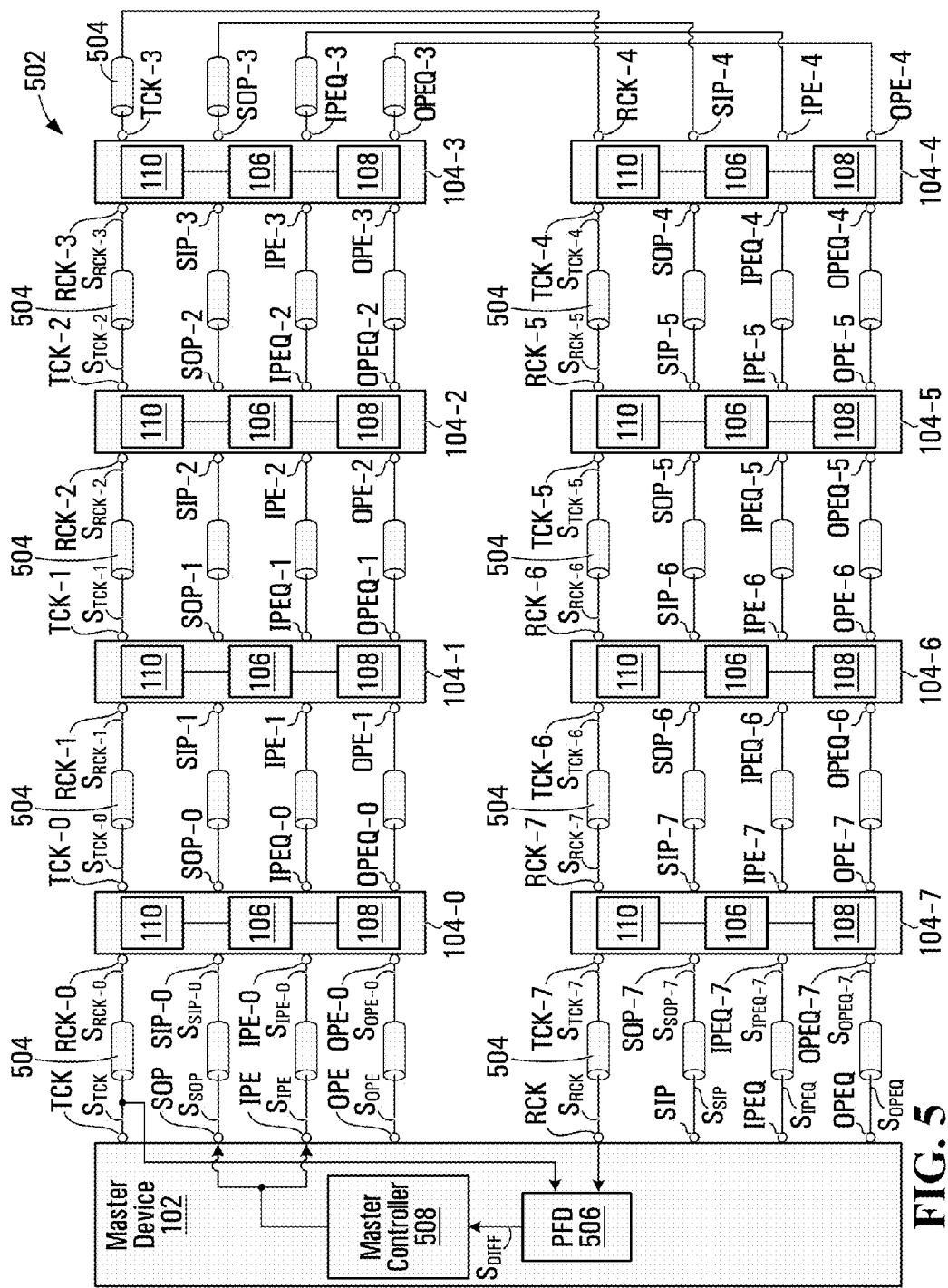
FIG. 5 is a block diagram showing details of interconnections between neighbouring devices in the configuration of FIG. 1.

Reference is now made to FIG. 5, which shows a system 502 including a configuration of series-connected semiconductor devices 104-0 - - - 7. In this example, the system 502 includes the master device 102 described earlier and eight (8) slave devices 104-0 - - - 7, each similar in structure to slave device 104-j described earlier. It should of course be apparent to those of ordinary skill in the art that the system 502 may include any number of slave devices connected in point-to-point fashion.

Each of the slave devices 104-0 - - - 7 is similar in structure to slave device 104-j described earlier. That is, each of the slave devices 104-0 - - - 7 has an interface compatible with the interface of slave device 104-j described earlier. Accordingly, each of the slave devices 104-0 - - - 7 has an interface comprising a serial input port (SIP-0 - - - 7) a serial output port (SOP-0 - - - 7), an input port enable input port (IPE-0 - - - 7), an output port enable input port (OPE-0 - - - 7), an input port enable echo output port (IPEQ-0 - - - 7), an output port enable echo output port (OPEQ-0 - - - 7), a clock input port (RCK-0 - - - 7) and a clock output port (TCK-0 - - - 7). In addition, the interface of each of the slave devices 104-0 - - - 7 may include a chip select port (not shown) and a reset port (not shown).

It should be appreciated that different types of slave devices can be utilized as along as they have compatible interfaces. Generally, the system 502 can comprise various kinds of semiconductor integrated circuit devices as slave devices in the configuration. For example, where the slave devices are memory devices, such memory devices may be of the same type (e.g., all having NAND Flash memory core), or they may be of different types (e.g., some having NAND Flash memory core and others having DRAM memory core). Other combinations of memory types and device types occurring to those of skill in the art are within the scope of the present invention.

The master device 102 has an interface comprising a plurality of output ports for providing a group of signals to a first slave device 104-0 of the configuration. Specifically, the interface of the master device 102 comprises a master clock output port (hereinafter, the "TCK port") over which is output a master output clock signal $S_{TCK}$, a master serial output port (hereinafter, the "SOP port") over which is provided a master serial output information signal $S_{SOP}$, a master serial input port enable output port (hereinafter, the "IPE port") over which is provided a master serial input port enable signal $S_{IPE}$, and a master serial output port enable output port (hereinafter, the "OPE port") over which is provided a master serial output port enable signal $S_{OPE}$.

The interface of the master device 102 may further comprise various ports over which can be provided the chip select signal, the reset signal and various other control and data information destined for the slave devices 104-0 - - - 7.

The interface of the master device 102 further comprises a plurality of input ports over which are received a group of signals from the last slave device 104-7 of the configuration. Specifically, the interface of the master device 102 comprises a master clock input port (hereinafter, the "RCK port") over which is received a master input clock signal $S_{RCK}$, a master serial input port (hereinafter, the "SIP port") over which is provided a master serial input information signal $S_{SIP}$, a master serial input port enable echo input port (hereinafter, the "IPEQ port") over which is provided a master serial input port enable echo signal $S_{IPEQ}$, and a master serial output port enable echo input port (hereinafter, the "OPEQ" port) over which is provided a master serial output port enable echo signal $S_{OPEQ}$.

The system 502 forms a closed feedback loop in a ring type manner. That is to say, the output ports of the master device 102 (i.e., the TCK, SOP, IPE and OPE ports) are connected to the input ports of the first slave device 104-0 (i.e., the RCK-0, SIP-0, IPE-0 and OPE-0 ports, respectively), whose output ports (i.e., the TCK-0, SOP-0, IPEQ-0 and OPEQ-0 ports) are connected to the input ports of slave device 104-1 (i.e., the RCK-1, SIP-1, IPE-1 and OPE-1 ports, respectively). Next, the output ports of slave device 104-1 (i.e., the TCK-1, SOP-1, IPEQ-1 and OPEQ-1 ports) are connected to the input ports of slave device 104-2 (i.e., the RCK-2, SIP-2, IPE-2 and OPE-2 ports, respectively), whose output ports (i.e., the TCK-2, SOP-2, IPEQ-2 and OPEQ-2 ports) are connected to the input ports of slave device 104-3 (i.e., the RCK-3, SIP-3, IPE-3 and OPE-3 ports, respectively). This continues until slave device 104-7, whose input ports (i.e., the RCK-7, SIP-7, IPE-7 and OPE-7 ports, respectively) are connected to the output ports of slave device 104-6 (i.e., the TCK-6, SOP-6, IPEQ-6 and OPEQ-6 ports), and whose output ports (i.e., the TCK-7, SOP-7, IPEQ-7 and OPEQ-7 ports) are connected to the input ports of the master device 102 (i.e., the RCK, SIP, IPEQ and OPEQ ports, respectively).

For the purposes of simplifying the description, the system 502 shows (and the remainder of the description focuses on) single-bit-wide (×1) input and output signals; however, it should be apparent that the input and output signals can be wider than ×1 without departing from the spirit of the invention, such as ×2, ×4 and ×8, to name a few non-limiting possibilities.

The configuration shown in FIG. 5 allows the propagation of the master clock output signal $S_{TCK}$ as well as the master serial input port enable signal $S_{IPE}$ and the master serial output port enable signal $S_{OPE}$ from one slave device to the next, until these signals eventually return to the master device 102 in the form of the master clock input signal $S_{RCK}$, the master serial input port enable echo signal $S_{IPEQ}$ and the master serial output port enable echo signal $S_{OPEQ}$, respectively.

It should be appreciated that the interconnections between ports of neighboring devices occurs through an "interconnection load", illustrated in the drawings as 504. The interconnection load 504 may consist of one or more of: bonding wire load inside the package; PCB (printed circuit board) trace load; package soldering ball load; and the like. When the system 502 is implemented in a single package including plurality of slave devices (in this case, the eight slave devices 104-0 - - - 7 but generally any number) and a master device 102, this is known as a Multi-Chip-Package (MCP) and in such cases, the interconnection load 504 may consist of a loading of the wire interconnection between the chips of the MCP. The interconnection load 504 between the devices may vary due to various conditions such as, PCB layer mismatches in length and shapes; also, in an MCP realization, the interconnection load 504 inside the MCP is different from the interconnection load 504 that arises from the PCB. Thus, although the interconnection load 504 is denoted in the drawings by a single numeral, in reality it should be understood that this load may vary from one interconnection to the other.

In operation, the master device 102 generates the master clock signal $S_{TCK}$, which is sent out to the first slave device 104-0 and reaches the latter's RCK-0 port via the interconnection load 504 in the form of the input clock signal $S_{RCK-0}$. The master device 102 also generates serial information in the form of the master serial output information signal $S_{SOP}$, which is sent out to the first slave device 104-0 in synchronism with the master clock signal $S_{TCK}$. The serial information is received by the first slave device 104-0 at the latter's SIP-0 port via the interconnection load 504 in the form of the serial input information signal $S_{SIP-0}$. The master device 102 also ensures that the master serial output information signal $S_{SOP}$ is aligned with the master serial input port enable signal $S_{IPE}$, which is received by the first slave device 104-0 at the latter's IPE-0 port via the interconnection load 504 in the form of the input port enable signal $S_{IPE-0}$.

The slave controller 106 in the first slave device 104-0 determines whether the serial information is destined for the first slave device 104-0. If the serial information is destined for the first slave device 104-0, the slave controller 106 interprets this information and takes action. For instance, where the first slave device 104-0 is a memory device, the serial information may be a read command or a write command. In the case of a write command, further address and data information is expected to arrive via the SIP-0 port, with the data information being transferred by the slave controller 106 into the memory array 108. In the case of a read command, further address information is expected to arrive via the SIP-0 port, and will indicate which information from the memory array 108 is to be placed onto the SOP-0 port. The slave controller 106 also ensures that the information read from the memory array 108 is aligned with the master serial output port enable signal $S_{OPE}$, which is received by the first slave device 104-0 at the latter's OPE-0 port via the interconnection load 504 in the form of the output port enable signal $S_{OPE-0}$.

On the other hand, if the serial information is not destined for the first slave device 104-0, the first slave device 104-0 simply re-transmits the received serial information towards the next slave device 104-1, in synchronism with the output clock signal $S_{TCK-0}$. That is, the slave controller 106 transfers the serial information received via the SIP-0 port onto the SOP-0 port.

Additionally, and regardless of whether or not the serial information is destined for the first slave device 104-0, the slave controller 106 transfers the signals appearing at the IPE-0 and OPE-0 ports onto the IPEQ-0 and OPEQ-0 ports, respectively.

Additionally, the input clock signal $S_{RCK-0}$ is propagated to the next slave device 104-1. Specifically, the input clock signal $S_{RCK-0}$ is processed by the clock synchronizer 110, which outputs an intermediate clock signal $S_{CLK\_INT}$. The intermediate clock signal passes through the buffer element 134 and the output buffer 122-1 before being output via the TCK-0 port in the form of an output clock signal $S_{TCK-0}$. Under initial conditions, the output clock signal $S_{TCK-0}$ will be approximately phase-locked with the input clock signal $S_{RCK-0}$.

The same basic operations are performed at the next slave device 104-1. It should be noted that at some point, the information appearing on the SOP-j port of a given one of the slave devices 104-0 - - - 7 may contain information that is destined for the master device 102. This is particularly the case where a read command has been issued to that slave device. This information continues to be propagated until it is transmitted in the form of the serial output information signal $S_{SOP-7}$ by the last slave device 104-7 via the latter's SOP-7 port. The slave controller 106 of the last slave device 104-7 outputs the serial output information signal $S_{SOP-7}$ in synchronism with the output clock signal $S_{TCK-7}$. The serial output information signal $S_{SOP-7}$ is received via the interconnection load 504 at the SIP port of the master device 102 in the form of the master serial input information signal $S_{SIP}$. Similarly, the output clock signal $S_{TCK-7}$ traverses an interconnection load 504 before being received at the RCK port of the master device 102 in the form of the master input clock signal $S_{RCK}$.

As can be appreciated from the above description, the master device 102 can send instructions to control the behavior of a selected one (or more) of the slave devices 104-0 - - - 7 in the configuration by using the TCK, SIP, IPE and OPE ports. Then, the selected slave device(s) respond(s) to the instructions from the master device 102 and transmit(s) an appropriate response further along the configuration. Ultimately, the master device 102 receives the response through its SIP, IPEQ and OPEQ ports.

It should further be noted that the interconnection loads 504 present between slave devices, and between the master device 102 and the first slave device 104-0 as well as the last slave device 104-7, add delay to propagating signals (including clock signals). Thus, the interconnection load 504 between the master device 102 and the first slave device 104-0 will cause the second slave device 104-1 to see a slightly sloped or delayed input clock signal $S_{RCK-1}$ compared to the output clock signal $S_{TCK-0}$. The clock synchronizer 110 in the second slave device 104-1 then performs a locking procedure based on the input clock signal $S_{RCK-1}$ and produces the output clock signal $S_{TCK-1}$ which, under initial conditions, will be approximately phase-locked with the input clock signal $S_{RCK-1}$. Next, the interconnection load 504 between the second and third slave devices 104-1 and 104-2 causes the third slave device 104-2 to see a slightly sloped or delayed input clock signal $S_{RCK-2}$ compared to the output clock signal $S_{TCK-1}$. The clock synchronizer 110 in the third slave device 104-2 then performs a locking procedure based on the input clock signal $S_{RCK-2}$ and produces the output clock signal $S_{TCK-2}$ which, under initial conditions, will be approximately phase-locked with the input clock signal $S_{RCK-2}$. This process continues, until the last slave device 104-7 produces the output clock signal $S_{TCK-7}$, which is received via the interconnection load 504 at the RCK port of the master device 102.

Thus, the master input clock signal $S_{RCK}$ at the RCK port is a propagated version of the master output clock signal $S_{TCK}$ that has been re-synchronized by the clock synchronizer 110 in each of the slave devices 104-0 - - - 7. The various interconnection loads 504 can cause an "interconnection load delay" which, under initial conditions, will cause the master input clock signal $S_{RCK}$ to be significant in phase error compared to the master output clock signal $S_{TCK}$. If the interconnection load delay were known, then a suitable value for the fixed component of the delay applied by the EA-FDU 206 in each of the slave devices 104-0 - - - 7 (namely, the fixed component $t_F$) could be chosen at the design phase in order to offset the interconnection load delay. However, the interconnection load delay is varying and unpredictable, so that it cannot be accounted for at the design phase. Accordingly, in an embodiment of the present invention, the master device 102 is configured to dynamically update the EA-FD register 220 in each of the slave devices 104-0 - - - 7.

More specifically, as shown in FIG. 5, in addition to its other components useful in generating various output signals and processing various input signals, the master device 102 comprises a phase frequency detector (PFD) 506 and a master controller 508. The PFD 506 has a first input port connected to the RCK port and receives the master clock input signal $S_{RCK}$ therefrom. In addition, the PFD 506 has a second input port that receives a version of the master output clock signal $S_{TCK}$. To this end, the second input port of the PFD 506 may be branched off of the TCK port, or it may obtain the master output clock signal $S_{TCK}$ via a clock distribution tree internal to the master device 102. The PFD 506 is configured to determine a phase and/or frequency difference between the clock signals at its two input ports, and to provide a difference signal indicative of this difference at an output port of the PFD 506.

Figure 6:
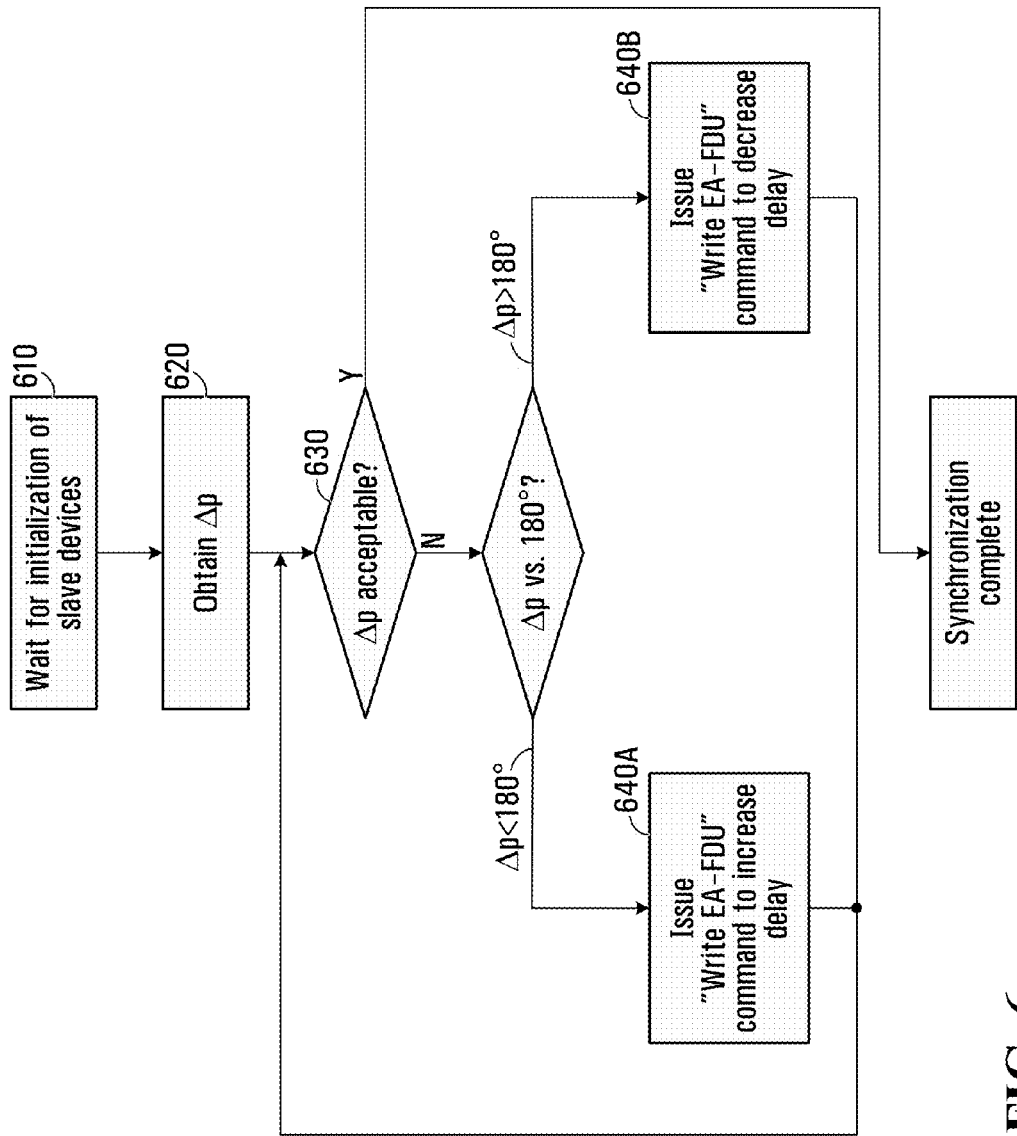
FIG. 6 is a flowchart showing steps in a synchronization process executed by the system controller of FIG. 1, in accordance with a non-limiting example embodiment of the present invention.

The difference signal $S_{DIFF}$ output by the PFD 506 is provided to an input port of the master controller 508. The master controller 508 is configured to execute a synchronization process for adjusting the current value of the delay being applied by the EA-FDU 206 in one or more of the slave devices 104-0 - - - 7 based on the difference signal $S_{DIFF}$ received from the PFD 506. This is achieved by issuing commands such as the "Write EA-FDU" command via the SIP and IPE ports. Details of an embodiment of the synchronization process are provided below with reference to a sequence of steps illustrated in FIG. 6.

At step 610, the master controller 508 waits for an initialization procedure to be performed in each of the slave devices 104-0 - - - 7. Specifically, system power is applied and, in response, the slave devices 104-0 - - - 7 in the system 502 each perform a respective initialization procedure according to design specifications. The initialization procedure includes initial locking of each slave device's respective EA-FDU 206 using the fixed component $t_F$, which may correspond to an estimate of the propagation delay through the slave device in question. After initial locking is complete, each of the slave devices 104-0 - - - 7 has brought its output clock signal $S_{TCK-j}$ in phase with its input clock signal $S_{RCK-j}$ by accounting for an estimate of this propagation delay. Other initialization functions, such as self-discovery and device address assignment procedures, may be performed without departing from the scope of the invention.

At step 620, once the initialization procedure is complete, the master controller 508 obtains the phase difference (denoted $\Delta p$) between the master input clock signal $S_{RCK}$ and the master output clock signal $S_{TCK}$. This can be done by reading the output from the PFD 506. It is recalled that $\Delta p$ is likely to be non-zero due to the presence of the interconnection loads 504 between slave devices and between the master device 102 and the first slave device 104-0 as well as the last slave device 104-7.

At step 630, $\Delta p$ determined at step 620 is compared to zero (or to a range of values considered to be indicative of "stability"). If $\Delta p$ is zero (or within the range of values considered to be indicative of "stability"), the system 502 is considered stable, and the synchronization process ends. If not, the master controller 508 begins a phase adjustment sub-routine. The phase adjustment sub-routine has two branches, a first branch 640A for the case where $\Delta p$ is less than 180 degrees, and a second branch 640B for the case where $\Delta p$ is greater than 180 degrees. The first and second branches 640A, 640B are described in greater detail below.

In the first branch 640A of the phase adjustment sub-routine, $\Delta p$ is less than 180 degrees, and therefore the master controller 508 aims to decrease the phase difference between the master input clock signal $S_{RCK}$ and the master output clock signal $S_{TCK}$. To this end, the master controller 508 issues a "Write EA-FDU" command to one or more target slave devices in order to cause these target slave devices to increase the current value of the delay being applied by their respective EA-FDUs 206.

In the second branch 640B of the phase adjustment sub-routine, $\Delta p$ is greater than 180 degrees, and therefore the master controller 508 aims to increase the phase difference between the master input clock signal $S_{RCK}$ and the master output clock signal $S_{TCK}$. To this end, the master controller 508 issues a "Write EA-FDU" command to one or more target slave devices in order to cause these target slave devices to decrease the current value of the delay being applied by their respective EA-FDUs 206.

The bit pattern specified by the "Write EA-FDU" command, and the number, identity and order of the target slave devices to which this command is sent, can be chosen based on design parameters. For instance, if $\Delta p$ is sufficiently close to zero (or 360) degrees, it is within the scope of the present invention to send a "Write EA-FDU" command to a single target slave device, such command specifying a decrement of −1, −2, −4 or −8 delay units.

However, if $\Delta p$ is significantly greater than zero degrees (and significantly less than 360 degrees), it is possible that asking a single target slave device to adjust the current value of the delay being applied by its EA-FDU 206 by such a large amount may cause it to malfunction (which may occur due to a lack of setup/hold time margins in its input/output latching circuits). Accordingly, the master controller 508 may distribute $\Delta p$ amongst a plurality of target devices, to be written to in sequence. The larger the sought after phase difference, the greater the number of target devices that will receive a "Write EA-FDU" command. As a result, the master controller 508 might send a "Write EA-FDU" command to a subset of not just one or two target slave devices, but a greater number of target slave devices, thereby to achieve a more even distribution of the desired delay adjustment over the system 502, and hence more stable system performance. Where multiple target slave devices are to be written to, it is within the scope of the present invention to develop an addressing scheme in order to reach more than one target slave device with a single "Write EA-FDU" command.

It is even possible that $\Delta p$ is sufficiently close to 180 degrees that it would require each of the slave devices to adjust the current value of the delay being applied by its respective EA-FDU 206 by at least one delay unit. Under such circumstances, it is within the scope of the present invention to send a "Write EA-FDU" command to each slave device in sequence; alternatively, a broadcast command may be issued. To determine that $\Delta p$ is indeed sufficiently close to 180 degrees to warrant consideration of a broadcast command, its magnitude $|\Delta p|$ may be compared to a bulk delay factor $T_{MAX}$. The bulk delay factor $T_{MAX}$ represents the estimated total interconnection load delay across the entire system 502. Where there are N slave devices in the configuration, the bulk delay factor $T_{MAX}$ can be set to N times an estimated individual interconnection load delay, denoted $t_{DLY}$. In the present example, N=8, and the bulk delay factor $T_{MAX}$ is equal to $8 \times t_{DLY}$, although in general N is not limited to any specific value. If $|\Delta p|$ is greater than the bulk delay factor $T_{MAX}$, then a broadcast "Write EA-FDU" command may be issued, which causes an adjustment to the current value of the delay being applied by the EA-FDU 206 in each of the slave devices 104-0 - - - 7.

Still other techniques exist for selecting the individual target slave devices susceptible of receiving a "Write EA-FDU" command, and for determining the desired delay adjustment relative to the current value of the delay being applied by the EA-FDU 206 in those target slave devices, with the aim of bringing $\Delta p$ to within an acceptable range; it should be understood that any of these techniques may be used without departing from the scope of the invention.

As can be appreciated from the above description of an embodiment, during execution of branch 640A or 640B, the master controller 508 generates one or more "Write EA-FDU" commands destined for one or more target slave devices, each such command containing a respective bit pattern indicative of a desired delay adjustment (e.g., an increment or a decrement) relative to the current value of the delay being applied by the EA-FDU 206 in the respective one or more target slave devices.

To take a specific non-limiting example, let it be assumed that the desired delay adjustment is +1 delay unit. Thus, based on previous bit pattern definitions, a "Write EA-FDU" command having a DATA byte of "00h" is sent to either (i) a specific target slave device or (ii) a subset of the slave devices or (iii) all of the slave devices, depending on the criteria mentioned above. This will increase the current value of the delay being applied by the EA-FDU 206 in each target slave device by one delay unit. The EA-FDU 206 in the target slave device performs a re-locking procedure as it detects that the feedback clock signal $S_{CLK\_FB}$ lags by one delay unit, which will cause the output clock signal $S_{TCK-x}$ (and, ultimately, the master input clock signal $S_{RCK}$) to advance its phase by an additional delay unit. After waiting for a certain amount of time (that can be pre-determined) in order to allow the target slave devices (and other non-target slave devices, if applicable) to respond to the "Write EA-FDU" command(s) issued during branch 640A or 640B, the synchronization controller returns to step 620, where the master controller 508 again obtains Δp indicative of the phase difference between the master input clock signal $S_{RCK}$ and the master output clock signal $S_{TCK}$.

Figure 7:
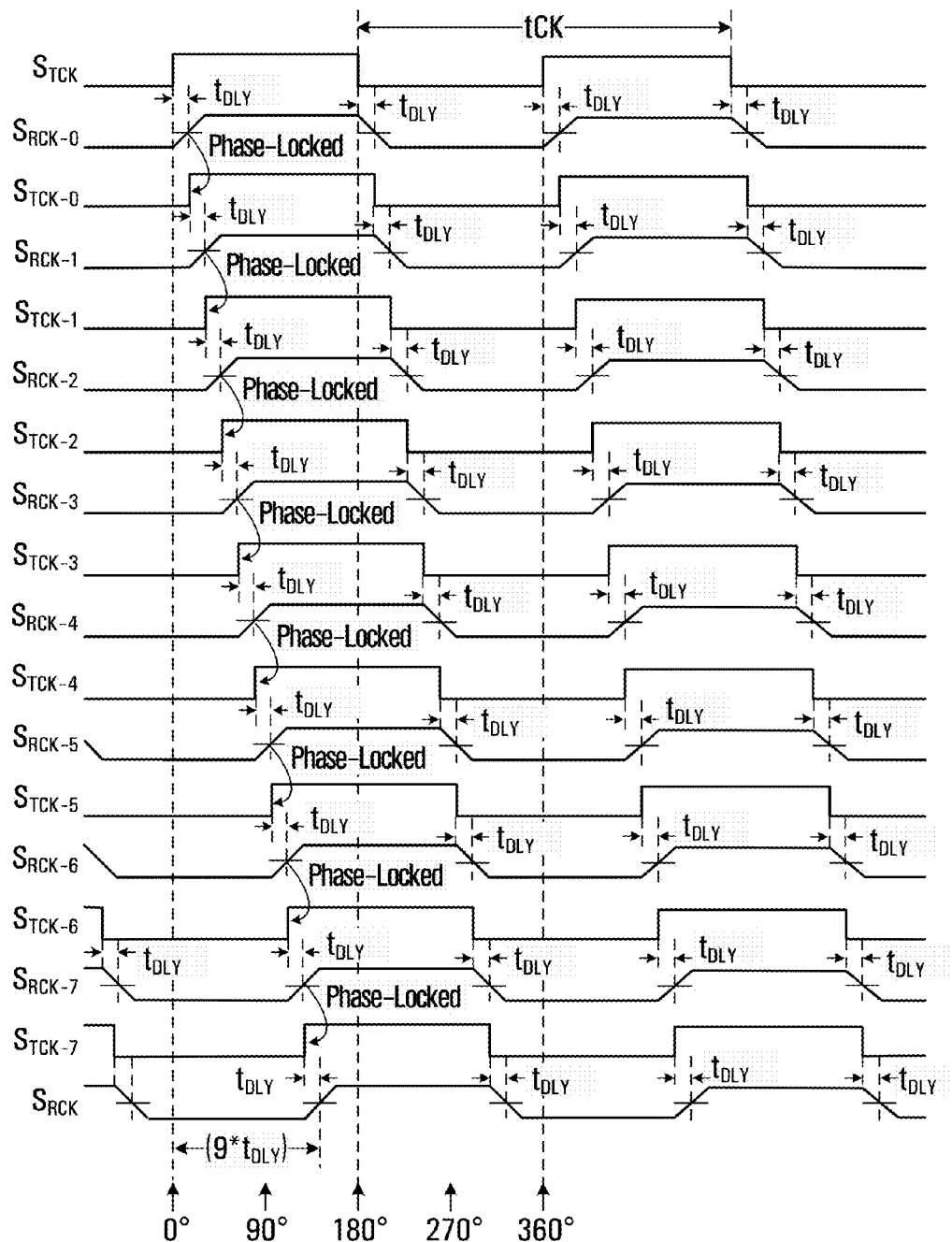
FIG. 7 is a timing diagram showing progression of certain signals exchanged between the devices of FIG. 5 in the absence of a clock synchronizer within the devices.
Figure 8:
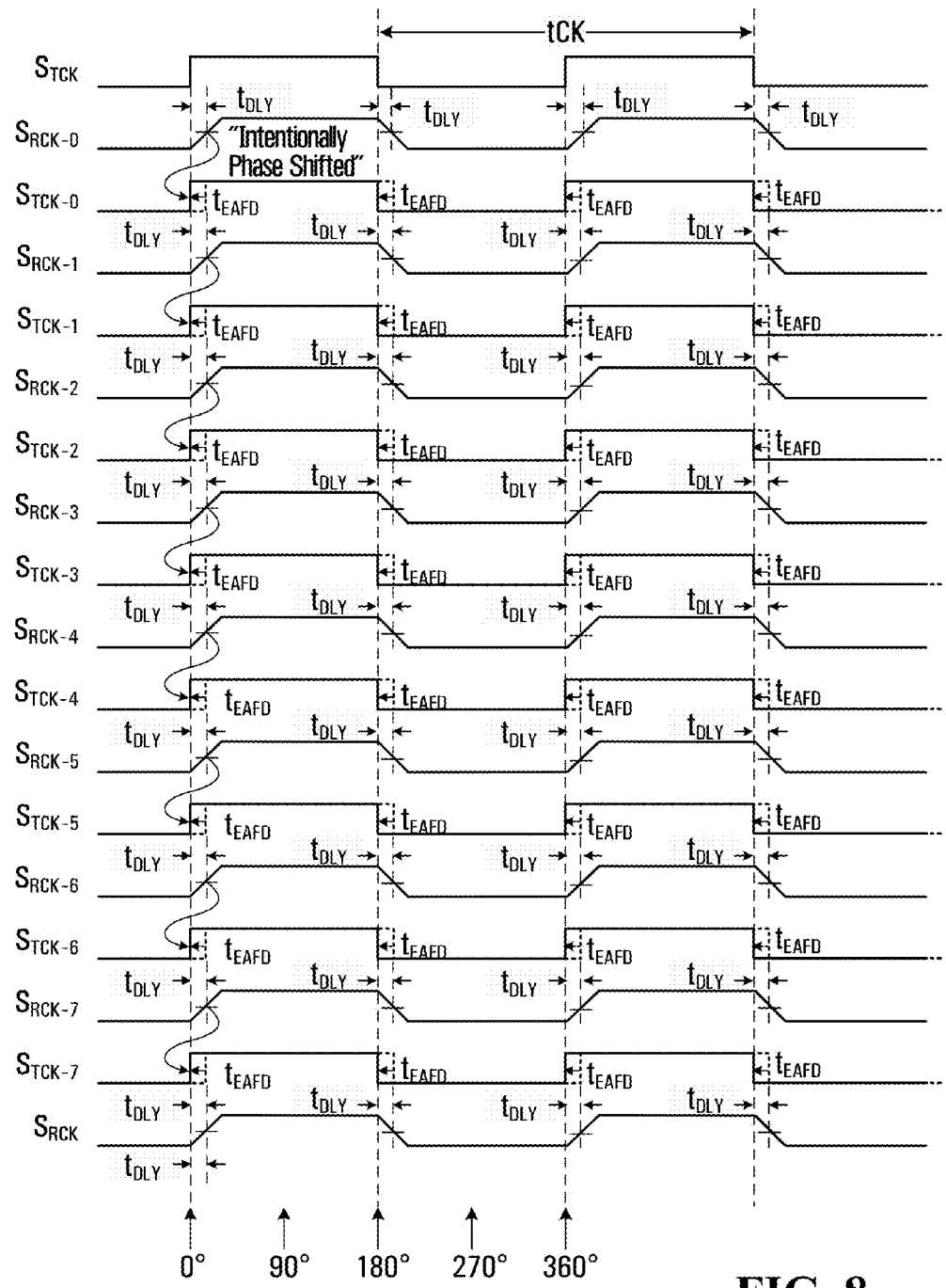
FIG. 8 is a timing diagram showing progression of certain signals exchanged between the devices of FIG. 5 when a clock synchronizer is provided within each of the devices in accordance with a non-limiting example embodiment of the present invention.

FIG. 7 shows a timing diagram illustrating what the performance of the configuration would be like without external adjustment of the clock synchronizer 110, relying solely on the fixed component $t_F$ of the delay being applied by the EA-FDU 206 in each clock synchronizer 110. (It is assumed in this example that the actual interconnection load delay corresponds to $t_{DLY}$, the estimated individual interconnection load delay mentioned previously). In contrast, FIG. 8 shows a timing diagram illustrating performance of the configuration with external adjustment of the clock synchronizer 110, after having brought Δp to within an acceptable range using a synchronization process such as the one described above. (It is assumed in these examples that the actual interconnection load delay corresponds to $t_{DLY}$, the estimated individual interconnection load delay mentioned previously).

In the case of FIG. 8, where a uniform distribution of delay across the slave devices 104-0 - - - 7 has been assumed, the current value of the delay being applied by the EA-FDU 206 in a given slave device 104-j will have converged to $t_{DLY}$. It should be noted that although $t_{DLY}$ is assumed to be the same for each slave device, it should be appreciated that in practice, it may be different for a given one of the slave devices 104-0 - - - 7. Also, a uniform distribution of delay across the slave devices 104-0 - - - 7 is not required.

Thus, it will be appreciated that by making adjustments to the value of the delay being applied by the EA-FDU 206 in one or more of the slave devices 104-0 - - - 7, it is possible to achieve phase-locking of the master output clock signal $S_{TCK}$ to the master input clock signal $S_{RCK}$ at the master device 102. It then becomes apparent that one may use an arbitrarily large number of slave devices as well as increase their operating frequency. Moreover, during operation, the master device 102 can re-adjust the current value of the delay being applied by the EA-FDU 206 of one or more slave devices by issuing "Write EA-FDU" commands if needed (e.g., as the temperature of the system 502 changes, etc.). It should also be appreciated that there is no need to incorporate costly data receiving and processing circuitry in the master device 102 to accommodate differences in the TCK and RCK clock domains.

It is recalled that the slave controller 106 of slave device 104-j writes to the respective EA-FD register 220 upon receipt and recognition of a "Write EA-FDU" command from the master device 102. In addition, those skilled in the art will appreciate that the slave controller 106 of slave device 104-j may also read from the EA-FD register 220 upon receipt and recognition of a "Read EA-FDU" command from the master device 102. Such a command can be useful in an implementation where the master device 102 wishes to know the current value of the EA-FD register 220 in specific ones the slave devices 104-0 - - - 7.

The "Read EA-FDU" command can be signaled by controlling the signals appearing on the SIP-j, IPE-j and OPE-j ports. More specifically, assuming that the signal at the IPE-j port is kept high, an example of a "Read EA-FDU" command may have the following 2-byte format:

| Command | 1st Byte | 2nd Byte |
|---|---|---|
| Read EA-FDU | "device address" | B1h |

In the above example format, the first byte ("device address") identifies slave device 104-j by its specific address. By recognizing its own address in the received information, the slave controller 106 will expect to receive further bytes of a command, and will expect to respond thereto.

In the above example format, the second byte (B1h) is a "further byte" of the "Read EA-FDU" command, and represents a hexadecimal value that indicates that the command is a "Read EA-FDU" command and not some other command. This is to help distinguish this command from other commands (such as the "Write EA-FDU" command) to which the slave controller 106 may be configured to respond. Of course, the precise hexadecimal value of the "Read EA-FDU" command is a design parameter and does not have any significance in this example other than to serve an illustrative purpose.

Figure 9:
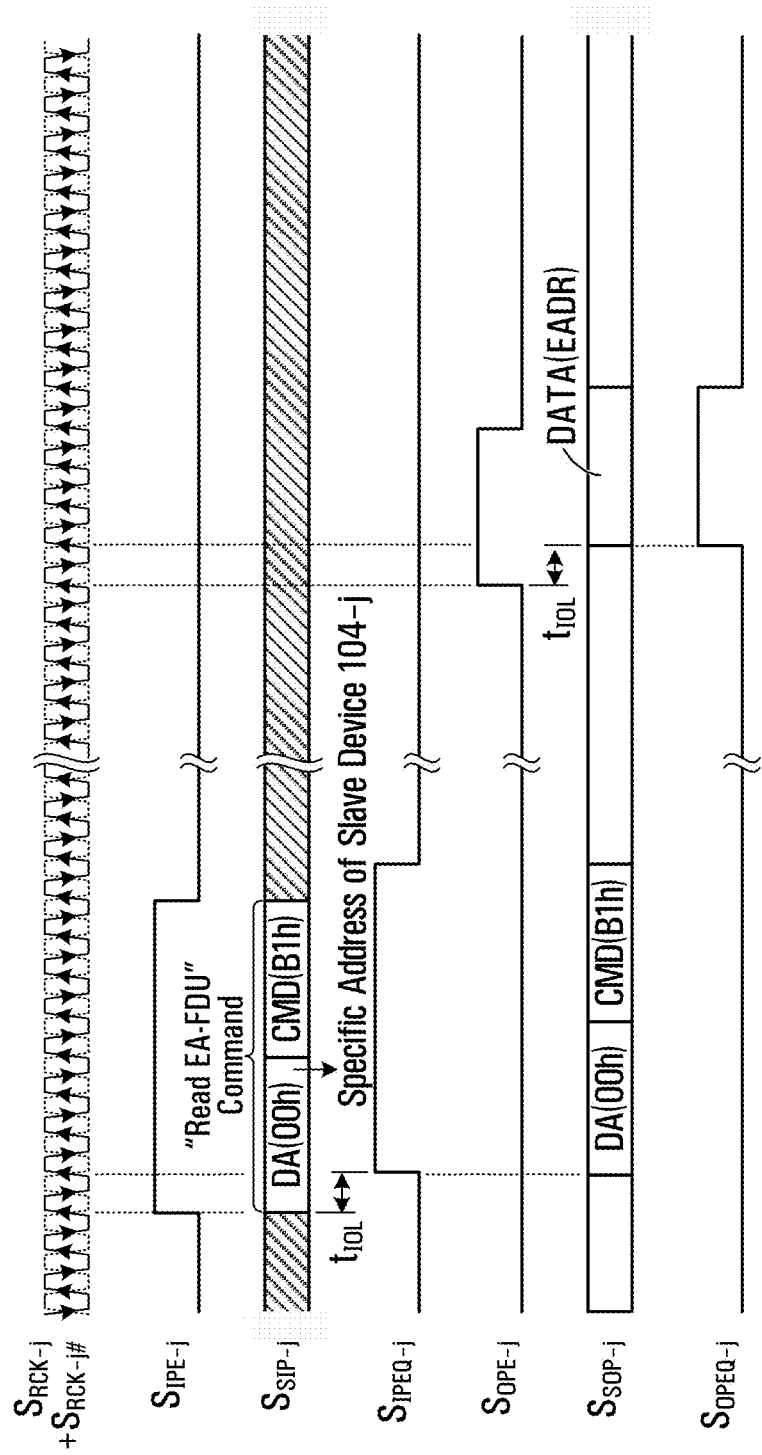
FIG. 9 is a timing diagram showing progression of certain signals within one of the devices shown in FIG. 1, in a scenario where the system controller issues a read command targeting the device and requesting information about the delay applied by the EA-FDU.

Assume now that slave device 104-j has a specific address of "00h". FIG. 9 shows a basic timing diagram for the "Read EA-FDU" command. It is noted that the output port enable signal $S_{OPE-j}$ appearing at the OPE-j port is set to high by the master device 102 in order to signal the time period during which the slave controller 106 is allowed and expected to transfer the contents of the EA-FD register 220 onto the SOP-j port.

In these timing diagrams, a differential clocking scheme is shown by way of non-limiting example, using a pair of input clock signals $S_{RCK-j}$+$S_{RCK-j\#}$. Also, a double data rate (DDR) approach is shown by way of non-limiting example. Furthermore, input-to-output latency (or "flow-through latency", denoted $t_{IOL}$) corresponds to one (1) clock cycle (or two (2) DDR cycles) in this specific example. Of course, in other implementations, a single-ended clocking scheme may be used, as well as a different clock rate type and port width.

Figure 10:
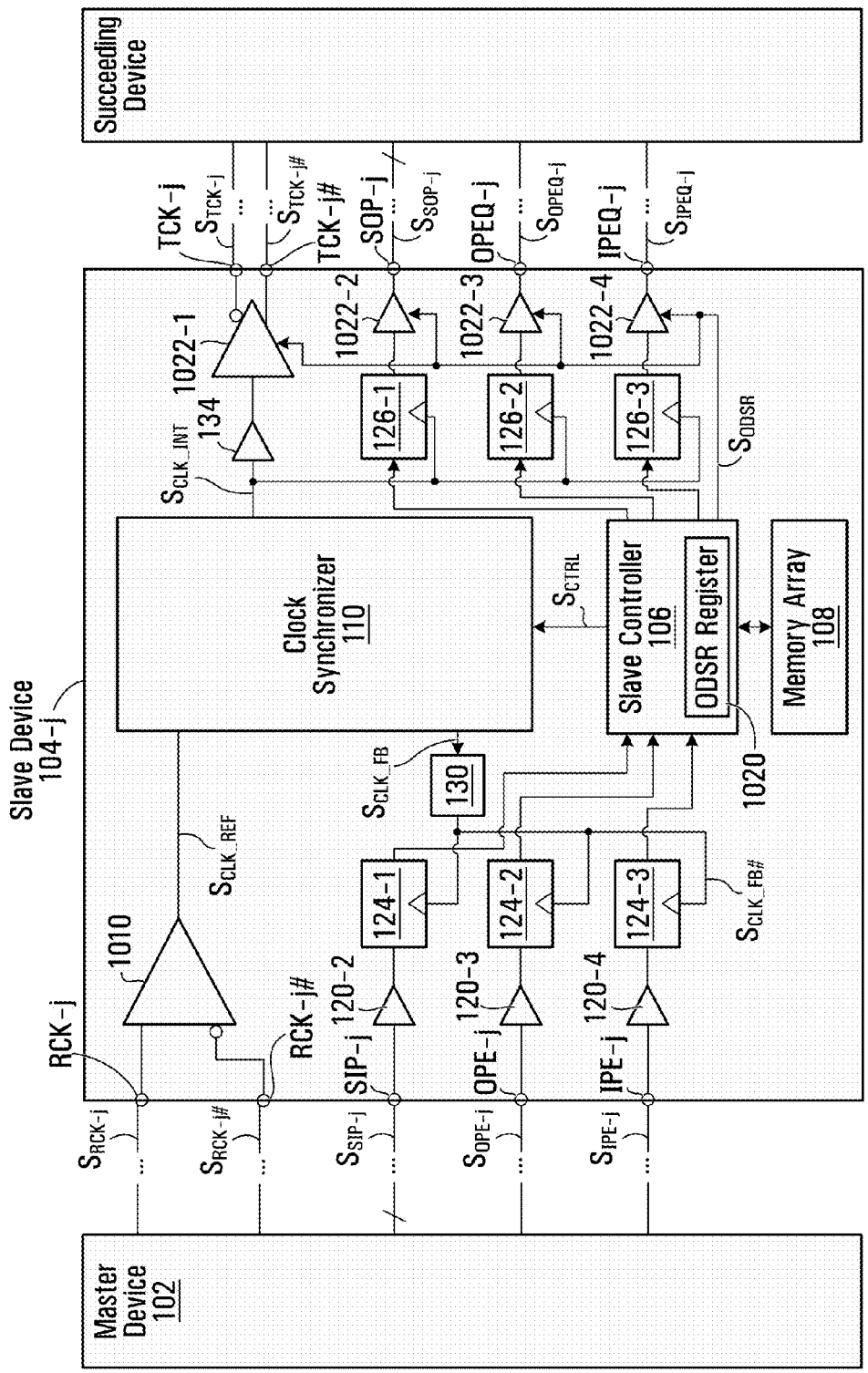
FIG. 10 is a block diagram showing details of one example of one of the devices of FIG. 1, in accordance with another non-limiting example embodiment of the present invention providing an adjustment in output drive strength.

Reference is now made to FIG. 10, which illustrates an additional feature that may be present in slave device 104-j, which is representative of one or more of the slave devices 104-0 - - - 7. Specifically, slave device 104-j is equipped with variable output drive strength control.

Before proceeding with the description of the output drive strength control feature, it should be mentioned that FIG. 10 shows an implementation of slave device 104-j where a differential clocking scheme (as opposed to a single-ended clocking scheme) is employed. Differential clocking schemes are popular in some high-speed applications. Specifically, instead of the input clock signal $S_{RCK-j}$, there is shown a pair of differential input clock signals, $S_{RCK-j}$ and $S_{RCK-j\#}$ arriving at ports RCK-j and RCK-j#. Similarly, instead of the output clock signal $S_{TCK-j}$, there is shown a pair of differential output clock signals $S_{TCK-j}$ and $S_{TCK-j\#}$ output via ports TCK-j and TCK-j#. The differential output clock signals $S_{TCK-j}$, $S_{TCK-j\#}$ are derived from the intermediate clock signal $S_{CLK\_INT}$, which can be single-ended, although it too may be differential.

There may be many different approaches in handling a differential clocking scheme internally in slave device 104-j, and any such approach can be used without departing from the scope of the invention. For example, in the non-limiting embodiment illustrated in FIG. 10, a new input buffer 1010 is provided in order to drive the aforementioned reference clock signal $S_{CLK\_REF}$ from the differential input clock signals $S_{RCK-j}$, $S_{RCK-j\#}$. The other input buffers 120-2, 120-3 and 120-4 can be as before.

Turning now to the output drive strength control feature, it will be noted that slave device 104-j includes a plurality of variable-strength output drivers 1022-1, 1022-2, 1022-3, 1022-4. Variable-strength output driver 1022-1 is connected to the TCK-j and TCK-j# ports. Variable-strength output drivers 1022-2, 1022-3 and 1022-4 are connected to the SOP-j, OPEQ-j and IPEQ-j ports, respectively. In the illustrated embodiment, the variable-strength output drivers 1022-1, 1022-2, 1022-3, 1022-4 have replaced the output buffers 122-1, 122-2, 122-3, 122-4 shown in FIG. 2B, but it should be appreciated that in other embodiments the variable-strength output drivers 1022-1, 1022-2, 1022-3, 1022-4 can be in addition to the output buffers 122-1, 122-2, 122-3, 122-4.

The variable-strength output drivers 1022-1, 1022-2, 1022-3, 1022-4 are capable of driving their respective output signals with a desired drive strength, as controlled by a modified slave controller 106. The variable-strength output drivers 1022-1, 1022-2, 1022-3, 1022-4 are when the output drive strength can be changed between, for example, "Full-Drive Strength" and "Half-Drive Strength" according to extended-mode register setting values. Other possibilities will occur to those of skill in the art.

In an embodiment of the present invention, the flexibility provided by the variable-strength output drivers 1022-1, 1022-2, 1022-3, 1022-4 serves to intentionally change the slew rate of the signals being output by slave device 104-j. The slew rate is particularly sensitive to the output drive strength due to the interconnection load between the devices in the configuration. When the slew rate of a given signal is changed, it will seem to a succeeding downstream device in the system 502 as if the signal were slightly delayed.

Thus, adjustments can be made to the output drive strength of the variable-strength output drivers 1022-1, 1022-2, 1022-3, 1022-4 in order to complement the above described adjustments to the EA-FD register 220, in order to achieve improved clock synchronization at the master device 102 between the master output clock signal $S_{TCK}$ and the master input clock signal $S_{RCK}$.

To this end, and in an example, the modified slave controller 106 may comprise an output drive strength (hereinafter, "ODSR") register 1020 that is capable of being written to by the master device 102. In a specific embodiment, the ODSR register 1020 contains a bit pattern that specifies a desired intensity to be applied by the variable-strength output drivers 1022-1, 1022-2, 1022-3, 1022-4. The slave controller 106 is configured to issue an ODSR control signal $S_{ODSR}$ indicative of the contents of the ODSR register 1020. The ODSR control signal $S_{ODSR}$ can be provided to a control port of each of the variable-strength output drivers 1022-1, 1022-2, 1022-3, 1022-4. The ODSR control signal $S_{ODSR}$ can be formatted such that, when interpreted by the variable-strength output drivers 1022-1, 1022-2, 1022-3, 1022-4 upon receipt at their respective control port, the ODSR control signal $S_{ODSR}$ will cause the desired intensity to be applied to by the variable-strength output drivers 1022-1, 1022-2, 1022-3, 1022-4. The desired intensity is a design parameter that can be made as large or as small as necessary to meet operational requirements.

Of course, it should be appreciated that the use of a differential or single-ended clocking scheme does not detract from the ability to achieve synchronization between the master output clock signal $S_{TCK}$ and the master input clock signal $S_{RCK}$ by commanding write operations to the EA-FD register 220 and possibly also the ODSR register 1020.

Various bit patterns that can be contained in the ODSR register 1020, and the possible significance of each such bit pattern in terms of the desired intensity to be applied by the variable-strength output drivers 1022-1, 1022-2, 1022-3, 1022-4, are provided in Table 2 below:

TABLE 2

| Description | Bit 7 | Bit 6 | Bit 5 | Bit 4 | Bit 3 | Bit 2 | Bit 1 | Bit 0 |
|---|---|---|---|---|---|---|---|---|
| ¼ Drive Strength | 0 | 0 | 0 | 0 | 0 | 0 | 0 | 0 |
| ½ Drive Strength | | | | | | 0 | 0 | 1 |
| 1× Drive Strength | | | | | | 0 | 1 | 0 |
| 2× Drive Strength | | | | | | 0 | 1 | 1 |
| 4× Drive Strength | | | | | | 1 | 0 | 0 |
| Reset To Default Drive Strength | 1 | 0 | 0 | 0 | 0 | 0 | 0 | 0 |
| Reserved | All Other Combinations | | | | | | | |

It should be understood that Table 2 shows example bit definitions for merely illustrative purposes. The bit patterns can be easily modified and/or expanded if finer or coarser granularity for the desired intensity is required.

It is recalled that the modified slave controller 106 writes to the ODSR register 1020 upon receipt and recognition of a command from the master device 102. Such a command may be formulated based on measurements of the output of the PFD 506 at the master device 102. Such a command, hereinafter referred to as a "Write ODSR" command, can be signaled by controlling the signals appearing on the SIP-j and IPE-j ports. More specifically, assuming that the signal at the IPE-j port is kept high, an example of a "Write ODSR" command may have the following 3-byte format:

| Command | 1st Byte | 2nd Byte | 3rd Byte |
|---|---|---|---|
| Write ODSR | "device address" | B2h | DATA |

In the above example format, the first byte ("device address") identifies slave device 104-j, either on an individual basis or as part of a group. By recognizing its own address (or one of its own addresses) in the received information, the modified slave controller 106 will expect to receive further bytes of a command, and will expect to respond thereto.

In the above example format, the second byte (B1h) is a "further byte" of the "Write ODSR" command, and represents a hexadecimal value that indicates that the command is a "Write ODSR" command and not some other command. This is to help distinguish this command from other commands (such as the "Write EA-FDU" and "Read EA-FDU" commands) to which the modified slave controller 106 may be configured to respond. Of course, the precise hexadecimal value of the "Read ODSR" command is a design parameter and does not have any significance in this example other than to serve an illustrative purpose.

In the above example format, the third byte (DATA) represents the bit pattern to be written to the ODSR register 1020, which can be in accordance with the above table.

Figure 11A:
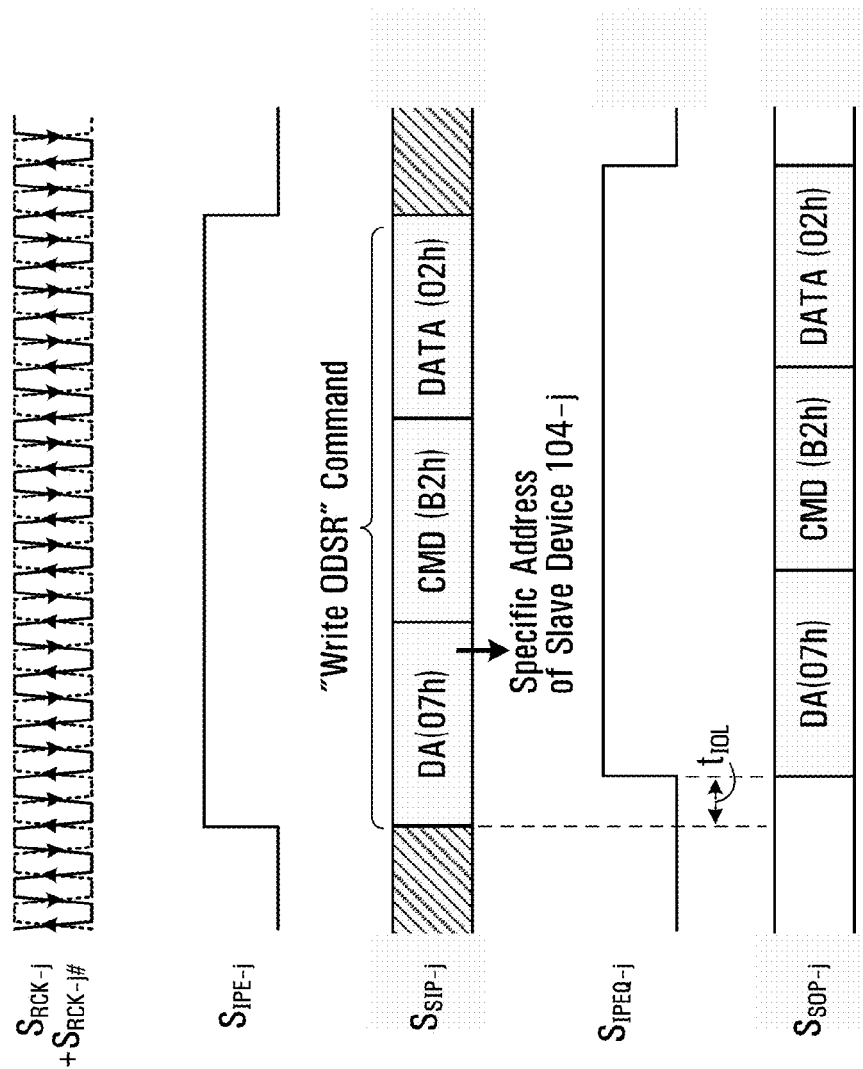
FIG. 11A is a timing diagram showing progression of certain signals within one of the devices shown in FIG. 1, in a scenario where the system controller issues a write command specifically targeting the device and carrying information for adjusting the output drive strength.
Figure 11B:
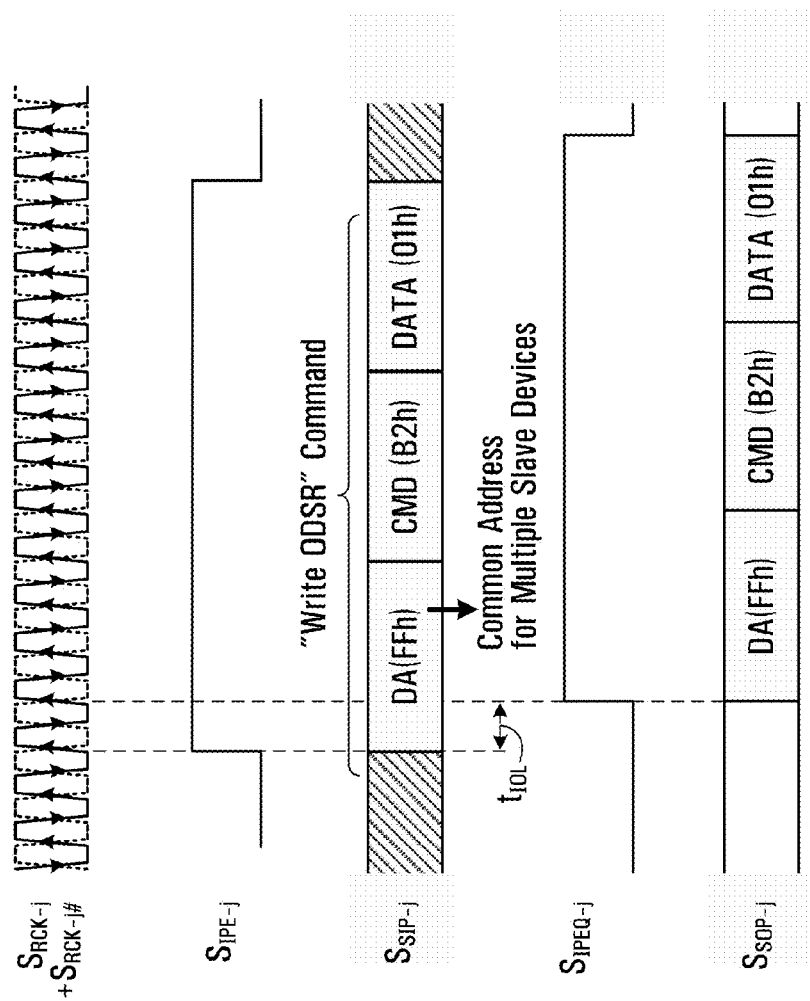
FIG. 11B is a timing diagram showing progression of the same signals as in FIG. 11A, but in a scenario where the command is broadcast by the system controller.

Assume now that slave device 104-j has a specific address of "07h" and a common address of "FFh". FIGS. 11A and 11B each show a basic timing diagram for the "Write ODSR" command. In the case of FIG. 11A, the "Write ODSR" command is destined specifically for slave device 104-j (with the desired intensity to be applied by the variable-strength output drivers 1022-1, 1022-2, 1022-3, 1022-4 is regular strength), while in the case of FIG. 11B, slave device 104-j is but one of several possible intended recipients of the "Write ODSR" command (with the desired intensity to be applied by the variable-strength output drivers 1022-1, 1022-2, 1022-3, 1022-4 being half-strength).

In these timing diagrams, a differential clocking scheme is shown by way of non-limiting example, using a pair of input clock signals $S_{RCK-j}+S_{RCK-j\#}$. Also, a double data rate (DDR)

approach is shown by way of non-limiting example. Furthermore, input-to-output latency (or "flow-through latency", denoted $t_{IOL}$) corresponds to one (1) clock cycle (or two (2) DDR cycles) in this specific example. Of course, in other implementations, a single-ended clocking scheme may be used, as well as a different clock rate type and port width.

In addition, those skilled in the art will appreciate that the modified slave controller 106 of slave device 104-j may also read from the ODSR register 1020 upon receipt and recognition of a "Read ODSR" command from the master device 102. Such a command can be useful in an implementation where the master device 102 wishes to know the current value of the ODSR register 1020 in specific ones the slave devices 104-0 - - - 7.

The "Read ODSR" command can be signaled by controlling the signals appearing on the SIP-j, IPE-j and OPE-j ports. More specifically, assuming that the signal at the IPE-j port is kept high, an example of a "Read ODSR" command may have the following 2-byte format:

| Command | 1st Byte | 2nd Byte |
|---|---|---|
| Read ODSR | "device address" | B3h |

In the above example format, the first byte ("device address") identifies slave device 104-j by its specific address. By recognizing its own address in the received information, the modified slave controller 106 will expect to receive further bytes of a command, and will expect to respond thereto.

In the above example format, the second byte (B3h) is a "further byte" of the "Read ODSR" command, and represents a hexadecimal value that indicates that the command is a "Read ODSR" command and not some other command. This is to help distinguish this command from other commands (such as the "Write EA-FDU", "Read EA-FDU" and "Write ODSR" command) to which the modified slave controller 106 may be configured to respond. Of course, the precise hexadecimal value of the "Read ODSR" command is a design parameter and does not have any significance in this example other than to serve an illustrative purpose.

Figure 12:
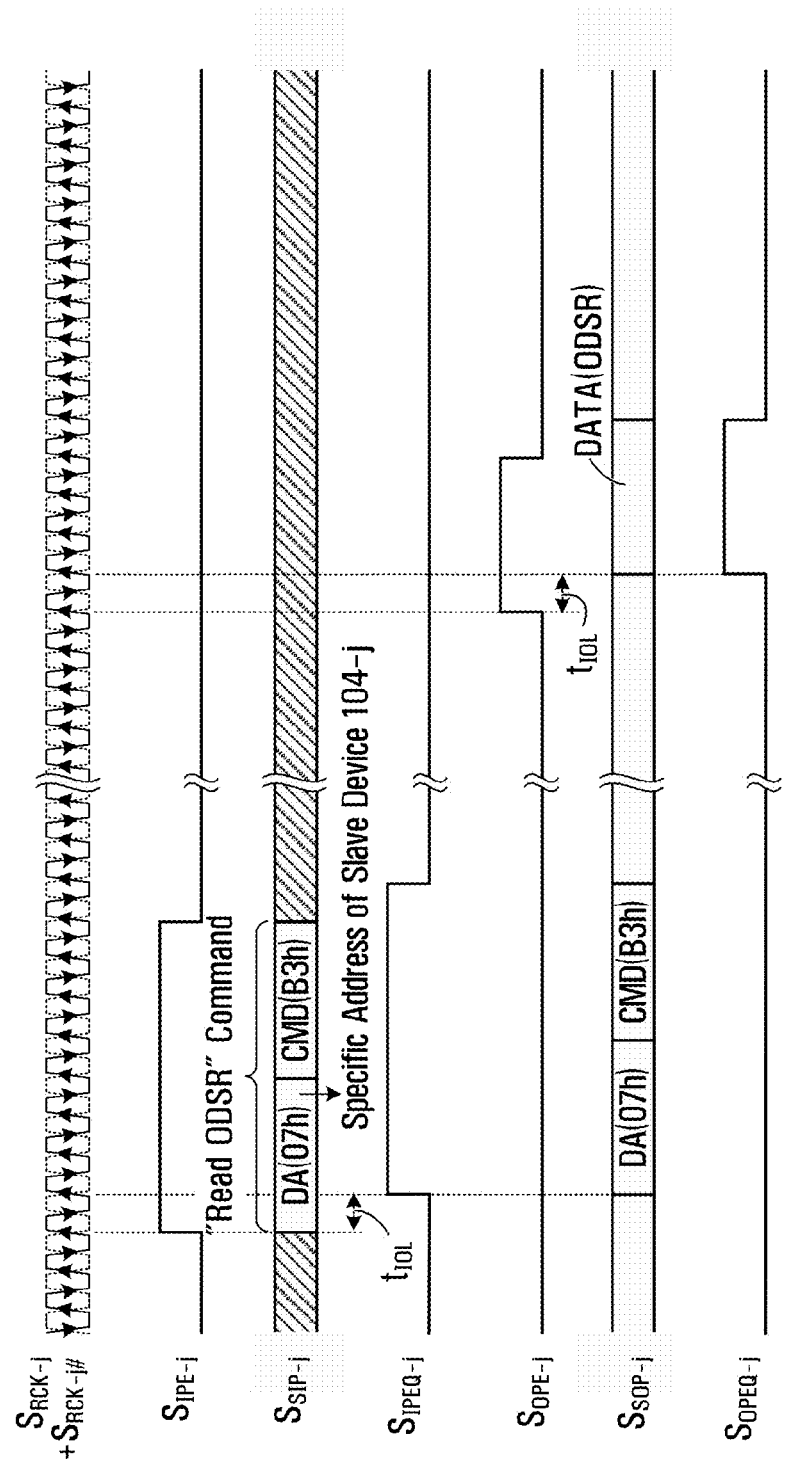
FIG. 12 is a timing diagram showing progression of certain signals within one of the devices shown in FIG. 1, in a scenario where the system controller issues a read command targeting the device and requesting information about the output drive strength.

Assume now that slave device 104-j has a specific address of "07h". FIG. 12 shows a basic timing diagram for the "Read ODSR" command. It is noted that the output port enable signal $S_{OPE-j}$ appearing at the OPE-j port is set to high by the master device 102 in order to signal the time period during which the modified slave controller 106 is allowed and expected to transfer the contents of the ODSR register 1020 onto the SOP-j port.

Figure 13:
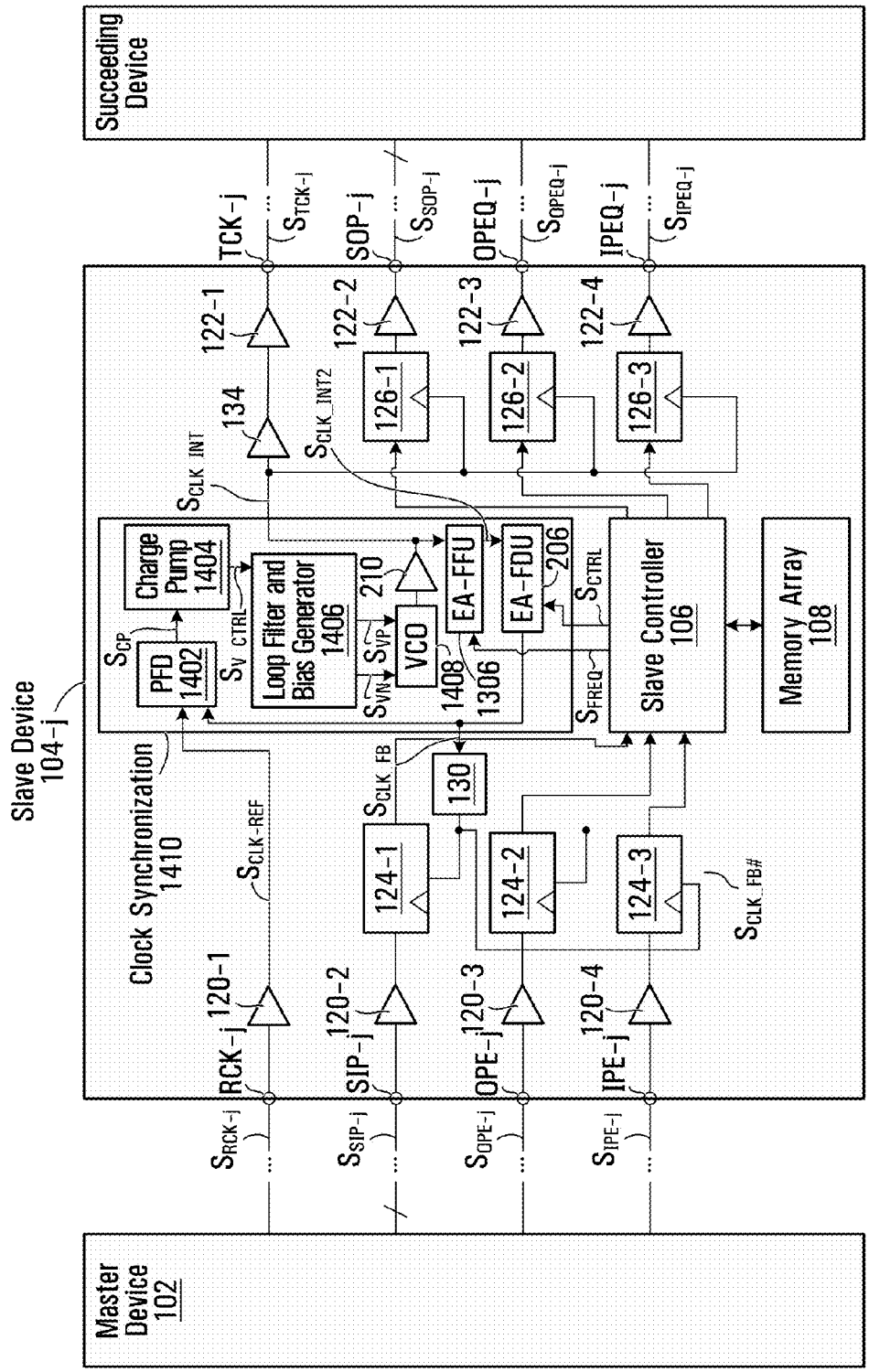
FIG. 13 is a block diagram showing further details of one of the devices shown in FIG. 1, including a voltage controlled oscillator and the EA-FDU.

In some cases, both the frequency and the phase can be adjusted by a single control signal provided to the clock synchronizer 110. For example, with reference to FIG. 13, there is shown an embodiment of slave device 104-j comprising a clock synchronizer 1410 that implements an externally adjustable phase-locked loop. To this end, the clock synchronizer 1410 comprises a phase frequency detector (PFD) 1402, a charge pump 1404, a loop filter and bias generator 1406, a voltage-controlled oscillator (VCO) 1408 and the previously described externally adjustable feedback delay unit (EA-FDU) 206.

The PFD 1402 is operative to generate a charge pump control signal $S_{CP}$ based on two signals received at respective input ports. The first signal is the reference clock signal $S_{CLK\_REF}$. The second signal is the feedback clock signal $S_{CLK\_FB}$ that is output by the EA-FDU 206. The PFD 1402 provides the charge pump control signal $S_{CP}$ via an output port. In an embodiment, the charge pump control signal $S_{CP}$ can be indicative of a voltage increment or decrement to be applied by the charge pump 1404.

The charge pump 1404 has an input port for receiving the charge pump control signal $S_{CP}$ from the PFD 1402. The charge pump 1404 produces a voltage control signal $S_{V\_CTRL}$ based on the charge pump control signal $S_{CP}$. The voltage control signal $S_{V\_CTRL}$ is provided at an output port of the charge pump 1404 and is fed to the loop filter and bias generator 1406.

The loop filter and bias generator 1406 receives the voltage control signal $S_{V\_CTRL}$ from the charge pump 1404 via an input port. The loop filter and bias generator 1406 produces two voltage control signals $S_{VBP}$ (PMOS bias voltage) and $S_{VBN}$ (NMOS bias voltage) based on the voltage control signal $S_{V\_CTRL}$. The two voltage control signals $S_{VBP}$ and $S_{VBN}$ are provided at respective output ports of the loop filter and bias generator 1406 and are fed to the VCO 1408.

The VCO 1408 receives the two voltage control signals $S_{VBP}$ and $S_{VBN}$ from the loop filter and bias generator 1406 via respective input ports. The VCO 1408 produces the intermediate clock signal $S_{CLK\_INT}$ based on the two voltage control signals $S_{VBP}$ and $S_{VBN}$. The intermediate clock signal $S_{CLK\_INT}$ is provided at an output port of the VCO 1408 and is fed to the input port of the EA-FDU 206. For more detail regarding operation of the VCO 1408, one may refer to "Low-Jitter Process-Independent DLL and PLL Based on Self-Biased Techniques" by John G. Maneatis, IEEE Journal of Solid-State Circuits, Vol. 31, No. 11, page 1723, November 1996, hereby incorporated by reference herein.

It is recalled that the EA-FDU 206 comprises a control port for receiving the control signal $S_{CTRL}$ from the modified slave controller 106. The EA-FDU 206 is operative to generate the feedback clock signal $S_{CLK\_FB}$ by applying a delay to the intermediate output clock signal $S_{CLK\_INT}$, such delay being a function of the control signal $S_{CTRL}$. As before, the current value of the delay being applied by the EA-FDU 206 is an example of a parameter that can be controlled by the modified slave controller 106.

In operation, the PFD 1402 detects a phase difference between the feedback clock signal $S_{CLK\_FB}$ and the reference clock signal $S_{CLK\_REF}$, and outputs the charge pump control signal $S_{CP}$ based on the detected phase difference. Thus, the output of the PFD 1402 will be zero when the phase of the feedback clock signal $S_{CLK\_FB}$ corresponds to the phase of the reference clock signal $S_{CLK\_FB}$. At this point, the clock synchronizer 1410 has achieved a state of "phase lock". In such a state, it will be observed that the feedback clock signal $S_{CLK\_REF}$ will be a delayed version of the intermediate clock signal $S_{CLK\_INT}$. In other words, the intermediate clock signal $S_{CLK\_INT}$ is an earlier version of the feedback clock signal $S_{CLK\_FR}$, which will have the same phase as the reference clock signal $S_{CLK\_REF}$ during a state of phase lock.

It should be understood that in alternative embodiments of the present invention, other implementations of a phase-locked loop are possible in conjunction with the EA-FDU 206.

In some cases, it is possible that the master output clock signal $S_{TCK}$ and the master input clock signal $S_{RCK}$ will not only be out of phase, but will also have a frequency offset relative to one another. In other words, the output of the PFD 506 obtained at step 620 indicates that there is a frequency difference (denoted $\Delta f$) in addition to, or instead of, the phase difference $\Delta p$. To accommodate this possibility, and with continued reference to FIG. 13, it is within the scope of the present invention for the clock synchronizer 110 to comprise an externally adjustable feedback frequency unit (denoted EA-FFU) 1306 in addition to, or instead of, the EA-FDU 206.

The EA-FFU 1306, which is optional, can be implemented in the form of a variable frequency converter (e.g., multiplier or divider) or other circuit known to those of skill in the art. The EA-FFU 1306 has an input port for receiving the intermediate clock signal $S_{CLK\_INT}$, and an output port for supplying another intermediate clock signal $S_{CLK\_INT2}$ for processing by the EA-FDU 206 (if indeed the EA-FDU 206 is present). The EA-FFU 1306 also comprises a control port for receiving a frequency control signal $S_{FREQ}$ from the slave controller 106. The EA-FFU 1306 is operative to generate the intermediate clock signal $S_{CLK\_INT2}$ by applying a frequency offset to the intermediate output clock signal $S_{CLK\_INT}$, such frequency offset being a function of the frequency control signal $S_{FREQ}$. The frequency offset applied by the EA-FFU 1306 is another example of a parameter that can be controlled by the slave controller 106.

It should be understood that the interconnection order between the EA-FDU 206 and the EA-FFU 1306 can be reversed (if indeed the EA-FDU 206 is present).

Persons skilled in the art should appreciate that embodiments of the present invention can be used in conjunction with other innovations relating to arrangements of serially interconnected semiconductor devices. Examples of such other innovations can be found in various patent applications, a set of which includes:

Ser. No. 60/722,368, filed Sep. 30, 2005;
Ser. No. 11/324,023, filed Dec. 30, 2005;
Ser. No. 11/496,278, filed Jul. 31, 2006;
Ser. No. 11/521,734, filed Sep. 15, 2006;
Ser. No. 11/606,407, filed Nov. 29, 2006;
Ser. No. 11/771,023 filed Jun. 29, 2007; and
Ser. No. 11/771,241 filed Jun. 29, 2007.

Although the above embodiments have described the "Write EA-FDU" command as containing a bit pattern that specifies a desired delay adjustment relative to the current value of the delay being applied by the EA-FDU 206, this is not to be construed as a limitation of the present invention. For example, in an alternative embodiment, the "Write EA-FDU" command may contain a bit pattern that specifies a desired actual value of the delay to be applied by the EA-FDU 206. In such cases, care should be taken to ensure that the format of the "Write EA-FDU" command provides sufficient dynamic range. Moreover, because in this alternative embodiment the EA-FD register 220 specifies a desired delay and not a desired delay adjustment, the slave controller 106 need not be concerned with clearing the EA-FD register 220 immediately after reading it or with reading the EA-FD register 220 only once after it is written to by the master device 102.

Also, although the above embodiments have described the "Write ODSR" command as containing a bit pattern that specifies a desired intensity to be applied by the variable-strength output drivers 1022-1, 1022-2, 1022-3, 1022-4, this is not to be construed as a limitation of the present invention. For example, in an alternative embodiment, the "Write ODSR" command may contain a bit pattern that specifies a desired adjustment to the current intensity being applied by the variable-strength output drivers 1022-1, 1022-2, 1022-3, 1022-4. In such cases, the modified slave controller 106 could be designed to clear the ODSR register 1020 immediately after reading it, or to read the ODSR register 1020 only once after it is written to by the master device 102.

Furthermore, although the above embodiments have described the "Write ODSR" command as containing a bit pattern that specifies a desired intensity to be applied by all of the variable-strength output drivers 1022-1, 1022-2, 1022-3, 1022-4 in a given target slave device, this is not to be construed as a limitation of the present invention. For example, in an alternative embodiment, there may be multiple ODSR registers, one for each of the variable-strength output drivers 1022-1, 1022-2, 1022-3, 1022-4. Accordingly, multiple "Write ODSR" commands may be generated, each containing a bit pattern that specifies a desired adjustment to the current intensity being applied by an individual one of the variable-strength output drivers 1022-1, 1022-2, 1022-3, 1022-4.

Also, although the above embodiments have described the clock response type of the slave devices 104-0 - - - 7 as being edge-aligned source-synchronous, this is not to be construed as a limitation of the present invention. In an alternative embodiment, the clock response type may be center-aligned source-synchronous. Still other possibilities are contemplated as being within the scope of the present invention.

In addition, although the above embodiments have described the clock rate type of the slave devices 104-0 - - - 7 as being either single data rate (SDR) or double data rate (DDR), this is not to be construed as a limitation of the present invention. For example, the clock rate type of the slave devices 104-0 - - - 7 may be quad data rate (QDR), octal data rate (ODR) or graphics double data rate (GDDR), to name a few non-limiting possibilities.

Also, although the components and circuitry of the various devices of the system 502 have been described as being responsive to "active high" signals, this should not be construed as a limitation of the present invention. For example, the components and circuitry of the various devices of the system 502 may be responsive to "active low" signals, depending on design preferences.

Moreover, where components and circuitry of the various devices of the system 502 have been illustrated as being directly connected to one another, one should appreciate that this has been done for the sake of simplicity and that other components and circuitry may be placed therebetween or coupled thereto without detracting from the spirit of the invention. As a result, what appear to be direct connections in the drawings may in fact be implemented as indirect connections in an actual realization.

Additionally, it should be appreciated that in some embodiments, a differential clocking scheme may be used, while in other embodiments, a single-ended clocking scheme may be used.

Furthermore, although many of the signals traveling between slave devices and other slave devices, or between the slave devices and the master device, have been described and illustrated as having a single bit-width, it will be within the purview of a skilled technician to modify the various components of the system 502 and their interfaces to allow for multi-bit-width signals. Also, it is within the scope of the present invention to provide multiple sets of signals each having a single bit-width. Thus, for example, where a two-bit wide clock is desired, one can implement this feature by using multiple single-bit-width clock sub-signals or by using a single clock signal that is two bits in width. For a signal requiring a greater bit width, a combination of sub-signals, each with a particular bit-width, can be used.

It should also be apparent to those of ordinary skill in the art that the operations and functions of certain ones of the above-described controllers, processors and other elements may be achieved by hardware or software.

While specific embodiments of the present invention have been described and illustrated, it will be apparent to those skilled in the art that numerous modifications and variations can be made without departing from the scope of the invention as defined in the appended claims.

What is claimed is:

1. A method for synchronizing a configuration of series-connected semiconductor memory devices, comprising:
    initializing the system; and,
    providing a first clock signal to a first memory device in a configuration of series-connected semiconductor memory devices; and,
    receiving a second clock signal from a second memory device in the configuration, the second clock signal corresponding to a version of the first clock signal that has undergone processing by a clock synchronizer in at least one of the memory devices in the configuration; and,
    processing the first and second clock signals to detect a phase difference there between; and,
    commanding an adjustment to the clock synchronizer in at least one of said memory devices in the configuration based on the phase difference;
    wherein the processing further includes obtaining the phase difference between a master input clock signal and a master output clock signal;
    wherein the processing compares the phase difference between the master input clock signal and the master output clock signal to a predetermined acceptable value and ends the process if the phase difference is acceptable.

2. A method for synchronizing a configuration of series-connected semiconductor memory devices as in claim 1, wherein the initializing step further includes initial locking of an externally adjustable feedback delay unit in at least one of said devices using an estimate of a propagation delay through the device in question.

3. A method for synchronizing a configuration of series-connected semiconductor memory devices as in claim 1, comprising the further step of determining if unacceptable phase shifts are more or less than 180°.

4. A method for synchronizing a configuration of series-connected semiconductor memory devices as in claim 3, wherein the commanding step increases delay if the phase shift is less than 180° and decreases delay if more than 180°.

5. A method for synchronizing a configuration of series-connected semiconductor memory devices as in claim 4, wherein the commanding step includes issuing a write EA-FDU command.

* * * * *